(12) United States Patent
Kawanago et al.

(10) Patent No.: US 11,968,437 B2
(45) Date of Patent: Apr. 23, 2024

(54) OPTICAL ELEMENT, OPTICAL DEVICE, IMAGING APPARATUS, AND MANUFACTURING METHOD OF OPTICAL ELEMENT

(71) Applicant: FUJIFILM Corporation, Tokyo (JP)

(72) Inventors: Atsushi Kawanago, Saitama (JP); Naoki Nishimoto, Saitama (JP); Shuhei Matsushita, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 129 days.

(21) Appl. No.: 17/688,819

(22) Filed: Mar. 7, 2022

(65) Prior Publication Data

US 2022/0201172 A1 Jun. 23, 2022

Related U.S. Application Data

(63) Continuation of application No. PCT/JP2020/036172, filed on Sep. 25, 2020.

(30) Foreign Application Priority Data

Sep. 27, 2019 (JP) ................................ 2019-177671

(51) Int. Cl.
*H04N 23/55* (2023.01)
*G01J 3/28* (2006.01)
*G02B 5/30* (2006.01)

(52) U.S. Cl.
CPC ............ *H04N 23/55* (2023.01); *G01J 3/2823* (2013.01); *G02B 5/3058* (2013.01); *G01J 2003/2826* (2013.01)

(58) Field of Classification Search
CPC ................... G01J 3/2823; G01J 3/0205; G01J 2003/2826; H01L 27/146; H04N 25/135;
(Continued)

(56) References Cited

U.S. PATENT DOCUMENTS 7,868,936 B2 * 1/2011 Ajito .................... H04N 25/134
348/336
8,106,344 B2 * 1/2012 Tamaki .................. H04N 23/54
348/152

(Continued)

FOREIGN PATENT DOCUMENTS

| CN | 102224431 | 10/2011 |
| CN | 205374966 | 7/2016 |

(Continued)

OTHER PUBLICATIONS

"Office Action of Japan Counterpart Application", dated May 15, 2023, with English translation thereof, p. 1-p. 8.

(Continued)

*Primary Examiner* — Pritham D Prabhakher
(74) *Attorney, Agent, or Firm* — JCIPRNET

(57) ABSTRACT

One embodiment according to the technology of the present disclosure provides an optical element, an optical device, an imaging apparatus, and a manufacturing method of the optical element, for capturing a multispectral image. An optical element according to an aspect of the present invention includes a plurality of optical filters including two or more optical filters that transmit light beams having at least partially different wavelength ranges, and a frame having an inclined surface portion with an optical axis center as an apex, in which the plurality of optical filters are installed on the inclined surface portion.

26 Claims, 20 Drawing Sheets

(58) Field of Classification Search
CPC .... H04N 25/131; H04N 23/55; G02B 5/3058; G02B 5/201; G02B 7/006; G02B 27/286
USPC ........................................................ 348/335
See application file for complete search history.

(56) References Cited

U.S. PATENT DOCUMENTS

| | | | |
|---|---|---|---|
| 9,118,796 | B2 | 8/2015 | Hiramoto et al. |
| 9,219,866 | B2* | 12/2015 | Shroff .................... G01N 21/27 |
| 9,658,463 | B2* | 5/2017 | Imamura ............ A61B 1/00096 |
| 2005/0041113 | A1* | 2/2005 | Nayar .................... H04N 23/81 |
| | | | 348/E5.078 |
| 2006/0279647 | A1 | 12/2006 | Wada et al. |
| 2009/0180020 | A1* | 7/2009 | Nayar .................... H04N 23/55 |
| | | | 348/335 |
| 2010/0127157 | A1* | 5/2010 | Tamaki .................. H04N 23/55 |
| | | | 359/619 |
| 2011/0222064 | A1 | 9/2011 | Umeda et al. |
| 2013/0077176 | A1 | 3/2013 | Ohtomo et al. |
| 2013/0135502 | A1 | 5/2013 | Hiramoto et al. |
| 2013/0258259 | A1* | 10/2013 | Nakai .................... H04N 25/60 |
| | | | 359/891 |
| 2014/0055661 | A1* | 2/2014 | Imamura ............ A61B 1/00096 |
| | | | 348/342 |
| 2016/0313183 | A1* | 10/2016 | Teraoka ................ G01J 3/2803 |
| 2018/0010763 | A1* | 1/2018 | Kyono .................. F21V 17/101 |
| 2018/0145479 | A1* | 5/2018 | Nakamura .......... H01S 5/02315 |
| 2018/0195902 | A1* | 7/2018 | Hays ....................... G01J 3/021 |

FOREIGN PATENT DOCUMENTS

| | | |
|---|---|---|
| CN | 205563060 | 9/2016 |
| JP | H088157 | 1/1996 |
| JP | 2003195136 | 7/2003 |
| JP | 2003262781 | 9/2003 |
| JP | 2005260480 | 9/2005 |
| JP | 2013072771 | 4/2013 |
| JP | 2014132266 | 7/2014 |
| JP | 2015017834 | 1/2015 |
| WO | 2012169136 | 12/2012 |
| WO | 2014020791 | 2/2014 |

OTHER PUBLICATIONS

"Office Action of China Counterpart Application", dated Oct. 11, 2023, with English translation thereof, p. 1-p. 22.

"International Search Report (Form PCT/ISA/210) of PCT/JP2020/036172," dated Nov. 2, 2020, with English translation thereof, pp. 1-5.

"Written Opinion of the International Searching Authority (Form PCT/ISA/237)" of PCT/JP2020/036172, dated Nov. 2, 2020, with English translation thereof, pp. 1-6.

"Office Action of China Counterpart Application No. 202080066962.0", issued on Feb. 22, 2024, with English translation thereof, p. 1-p. 17.

* cited by examiner

OPTICAL ELEMENT, OPTICAL DEVICE, IMAGING APPARATUS, AND MANUFACTURING METHOD OF OPTICAL ELEMENT

CROSS-REFERENCE TO RELATED APPLICATIONS

The present application is a Continuation of PCT International Application No. PCT/JP2020/036172 filed on Sep. 25, 2020 claiming priority under 35 U.S.C. § 119(a) to Japanese Patent Application No. 2019-177671 filed on Sep. 27, 2019. Each of the above applications is hereby expressly incorporated by reference, in its entirety, into the present application.

BACKGROUND OF THE INVENTION

1. Field of the Invention

The present invention relates to an optical element, an optical device, an imaging apparatus, and a manufacturing method of an optical element, for capturing a multispectral image.

2. Description of the Related Art

WO2014/020791A discloses a polarization color imaging apparatus capable of multispectral imaging by using a polarization sensor and pupil splitting. In addition, JP2014-132266A discloses a multimode imaging system in which a filter module is moved with respect to the imaging system.

SUMMARY OF THE INVENTION

One embodiment according to the technology of the present disclosure provides an optical element, an optical device, an imaging apparatus, and a manufacturing method of an optical element, which can easily acquire a multispectral image having a good image quality.

An optical element according to a first aspect of the present invention comprise a plurality of optical filters including two or more optical filters that transmit light beams having at least partially different wavelength ranges, and a frame having an inclined surface portion with an optical axis center as an apex, in which the plurality of optical filters are installed on the inclined surface portion.

A second aspect provides the optical element according to the first aspect, in which the frame has a plurality of the inclined surface portions.

A third aspect provides the optical element according to the first or second aspect, further comprising a fixing member that fixes the optical filters and the frame.

A fourth aspect provides the optical element according to the third aspect, in which the fixing member is an adhesive, the plurality of optical filters are fixed to the frame with the adhesive, and a portion of light-receiving regions of the plurality of optical filters, which is not covered with the adhesive, forms a light transmissive region.

A fifth aspect provides the optical element according to the fourth aspect, in which a plurality of window portions are filled with the adhesive in an amount corresponding to an area of the light transmissive region determined based on the wavelength ranges of the plurality of optical filters.

A sixth aspect provides the optical element according to any one of the first to fifth aspects, further comprising an inclination adjustment member that adjusts inclinations of the plurality of optical filters with respect to the inclined surface portion.

A seventh aspect provides the optical element according to the sixth aspect, in which a contact surface of the inclination adjustment member with the plurality of optical filters is an inclined surface.

An eighth aspect provides the optical element according to the sixth or seventh aspect, in which the inclination adjustment member is fixed to the frame.

A ninth aspect provides the optical element according to any one of the first to eighth aspects, in which a plurality of window portions each have a polarization portion that polarizes the light beams transmitted through the plurality of window portions.

A tenth aspect provides the optical element according to the ninth aspect, in which a direction of the polarization has a plurality of types.

An eleventh aspect provides the optical element according to the ninth or tenth aspect, in which the polarization portion is a wire grid or a slit formed in the plurality of window portions depending on a direction of the polarization.

A twelfth aspect provides the optical element according to any one of the first to eleventh aspects, in which the frame has a light-transmitting property.

A thirteenth aspect provides the optical element according to any one of the first to twelfth aspects, in which the frame has an aperture in a portion on which the plurality of optical filters are installed, and the optical element further comprises an aperture area adjustment member that adjusts an area of the aperture.

A fourteenth aspect provides the optical element according to any one of the first to thirteenth aspects, in which the plurality of optical filters are installed on the inclined surface portion at inclination angles corresponding to the wavelength ranges of the light beams transmitted through the optical filters.

An optical device according to a fifteenth aspect comprises the optical element according to any one of the first to fourteenth aspects, and a lens that forms an optical image of a subject, in which the optical element is disposed on an optical path of a light beam transmitted through the lens in a state in which an optical axis of the optical element and an optical axis of the lens coincide with each other.

An imaging apparatus according to a sixteenth aspect comprises the optical device according to the fifteenth aspect, an imaging element including a plurality of pixel groups that selectively receive a light beam transmitted through any of the plurality of optical filters, and a signal processing unit that generates a plurality of images corresponding to the wavelength ranges of the plurality of optical filters, respectively, based on a signal output from the imaging element.

A seventeenth aspect provides the imaging apparatus according to the sixteenth aspect, in which the imaging element includes a plurality of types of optical filters having different transmission wavelength ranges, and a plurality of types of polarization portions having different polarization directions on a pixel.

A manufacturing method according to an eighteenth aspect of an optical element including a plurality of optical filters including two or more optical filters that transmit light beams having at least partially different wavelength ranges, and a frame having an inclined surface portion with an optical axis center as an apex, in which the plurality of optical filters are installed on the inclined surface portion, the method comprising an installation step of installing the plurality of optical filters on a plurality of window portions, an inclination adjustment step of adjusting inclinations of the optical filters with respect to the inclined surface portion, and a fixation step of fixing the optical filters to the frame with a fixing member.

DESCRIPTION OF THE PREFERRED EMBODIMENTS

One embodiment of an optical element, an optical device, an imaging apparatus, and a manufacturing method of an optical element according to the present invention is as follows. In the description, the accompanying drawings will be referred to as needed.

First Embodiment

Configuration of Imaging Apparatus

Figure 1:
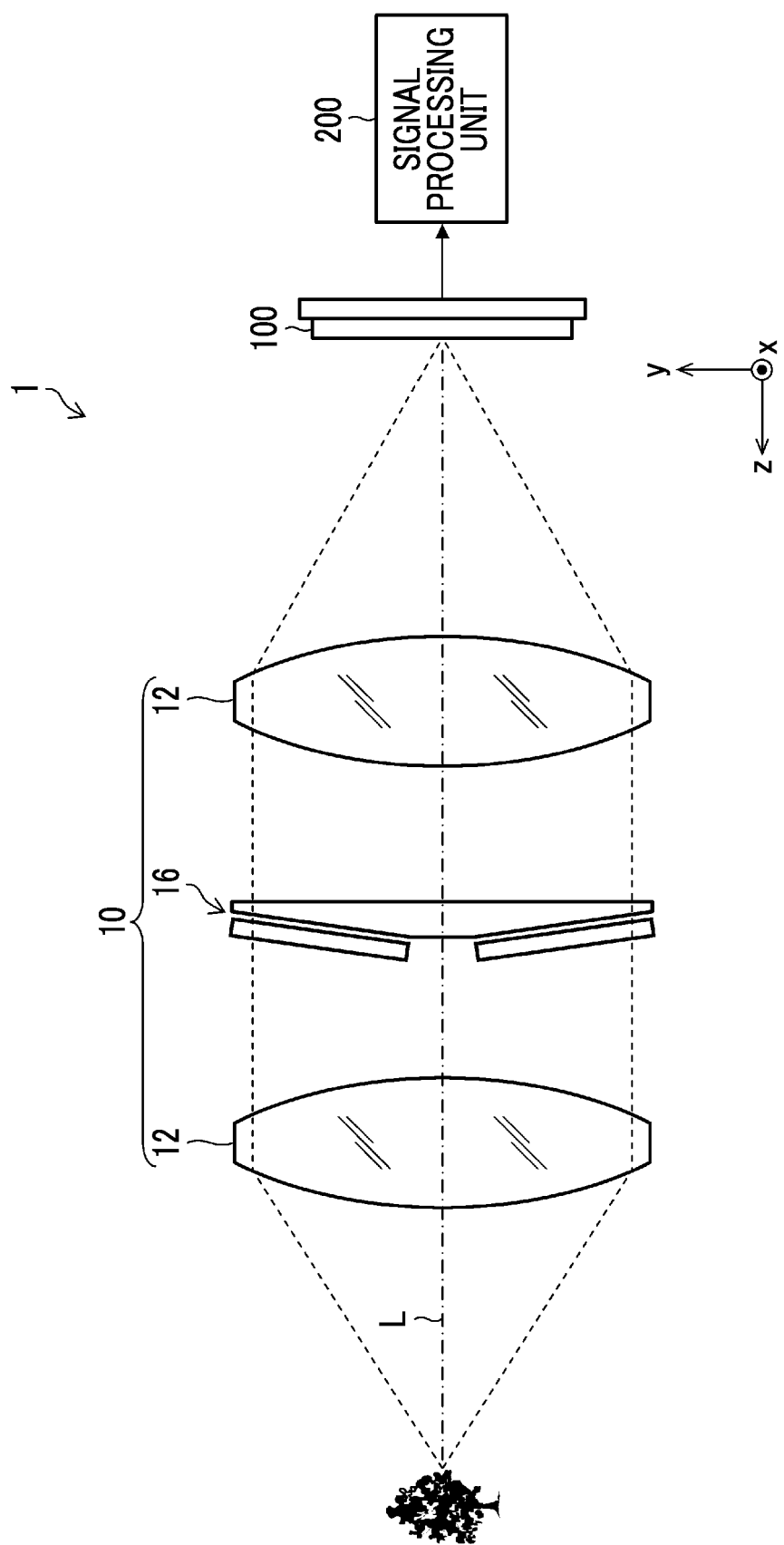
FIG. 1 is a view showing a schematic configuration of an imaging apparatus according to a first embodiment.

FIG. 1 is a view showing a schematic configuration of an imaging apparatus according to a first embodiment. An imaging apparatus 1 (imaging apparatus) according to the first embodiment is an imaging apparatus that captures a multispectral image of four bands, and mainly comprises an imaging optical system 10 (optical device), an imaging element 100 (imaging element), and a signal processing unit 200 (signal processing unit).

Imaging Optical System

The imaging optical system 10 is configured by a plurality of combinations of lenses 12 (lenses) that form an optical image of a subject, and has a filter unit 16 (optical element) in an optical path thereof. The filter unit 16 is disposed in the optical path of a light beam transmitted through the lens 12 in a state in which an optical axis L of the lens 12 and an optical axis L2 of the filter unit 16 (see FIG. 2) are aligned to each other (for example, at a pupil position or its vicinity). In addition, the imaging optical system 10 includes a focus adjustment mechanism (not shown). The focus adjustment mechanism adjusts the focus by moving a focus lens included in the imaging optical system 10 back and forth along the optical axis L.

Configuration of Filter Unit

The filter unit 16 is configured by a frame, bandpass filters (bandpass filters 50A to 50D, see FIG. 4: an optical filter), and a fixing member (adhesive 52; see FIGS. 7 and 8), and adjusts an inclination of the bandpass filter by an inclination adjustment member (inclination adjustment member 30: see FIGS. 4 to 7). Hereinafter, specific configurations of these members will be described.

Figure 2:
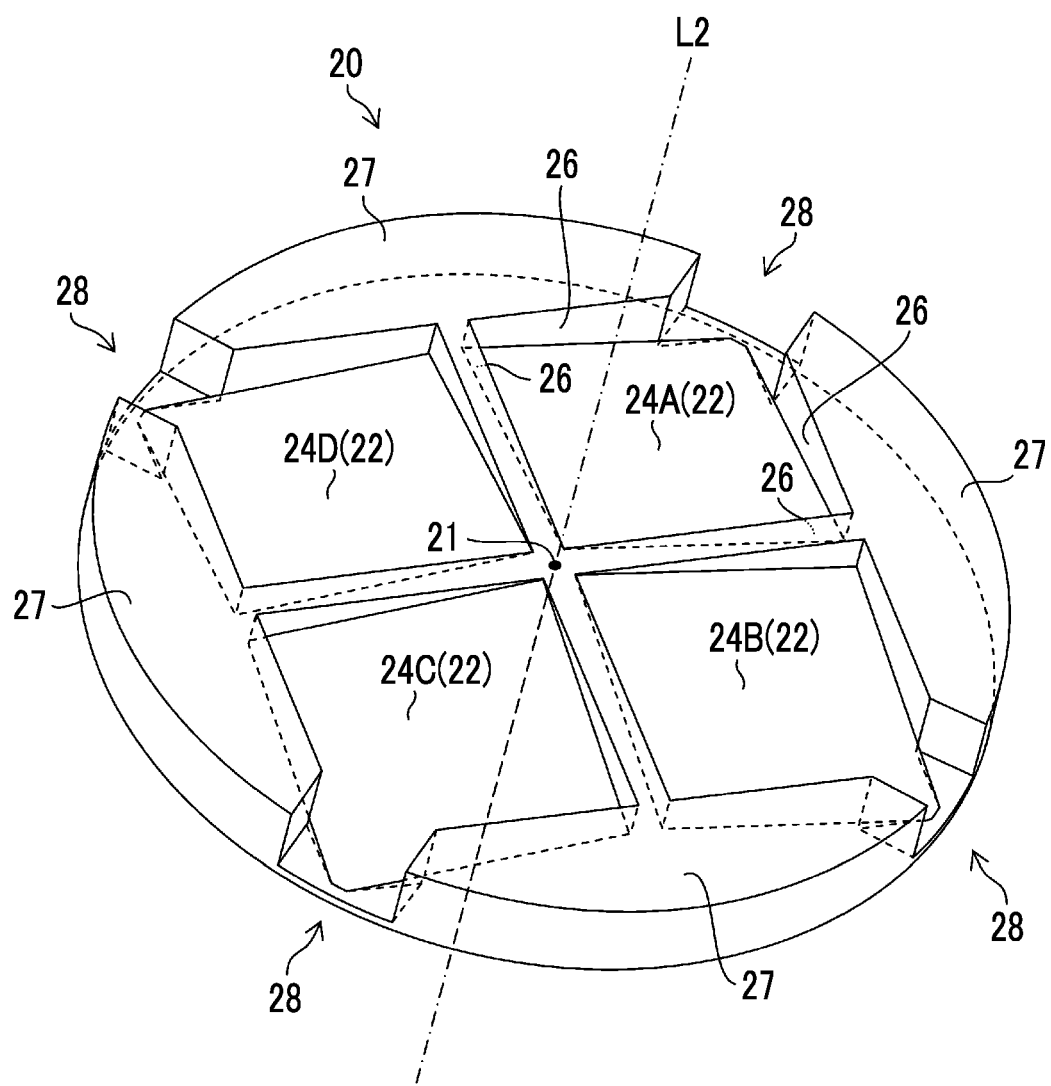
FIG. 2 is a perspective view showing a structure of a frame.

FIG. 2 is an external perspective view of a frame 20. The frame 20 is a light-transmitting property, and has a plurality of inclined surface portions 22 having a rectangular shape (inclined surface portions) (four in the example of FIG. 2). The four inclined surface portions 22 have a polygonal pyramid shape with an optical axis center 21 (optical axis center), which is a point at which the optical axis L2 intersects, as the apex. Note that term "light-transmitting property" means transmitting light beams in a desired wavelength range (for example, a wavelength range determined within a range from visible to near infrared). The inclined surface portion 22 is provided with four window portions 24A, 24B, 24C, and 24D (plurality of window portions) in which the bandpass filters 50A to 50D (see FIG. 4) are installed, respectively. In the present embodiment, the window portions 24A to 24D have a rectangular shape in which one corner (apex) is formed in the vicinity of the optical axis center 21, and wall portions 26 formed in side surfaces of the window portions 24A to 24D regulate positional deviation of the bandpass filters 50A to 50D. In addition, an insertion port 28 is provided at end portions of the window portions 24A to 24D (the corner opposite to the optical axis center 21), and the inclination adjustment member 30 (see FIGS. 4 and 6 to 8) is inserted (described below). Note that FIG. 2 shows an example in which the frame 20 has a plurality of inclined surface portions 22, but the optical element according to the embodiment of the present invention may have one inclined surface portion.

Polarization Portion

Figure 3:
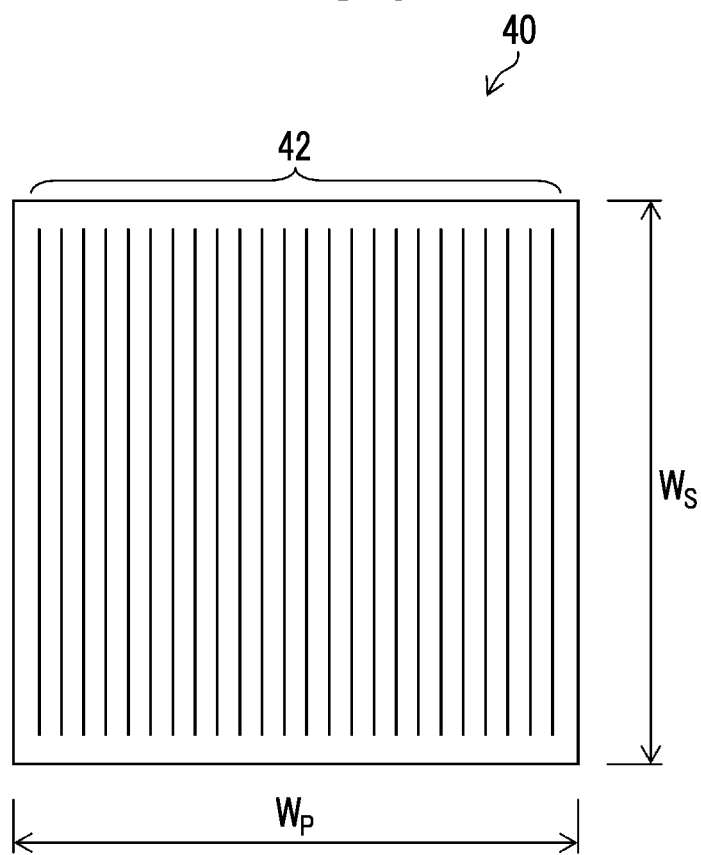
FIG. 3 is a view showing a configuration of a polarization portion.

A polarization film 40 on which a wire grid is formed is attached to the window portions 24A to 24D, and thus the window portions 24A to 24D function as the polarization portions. FIG. 3 is a conceptual view of the polarization film 40. The wire grid is a transparent resin film on which a pattern of wires 42 (for example, a pitch of about 100 nm to 150 nm) is formed by imprinting or the like. The light beam that oscillates in a direction orthogonal to the grid ($W_P$ direction in FIG. 3) is transmitted, and the light beam that oscillates in parallel to the grid ($W_S$ direction in FIG. 3) is reflected. By changing the direction of the polarization film 40 and attaching the polarization film 40 to the window portions 24A to 24D, it is possible to realize different polarization directions in the plurality of window portions (window portions 24A to 24D). Specifically, assuming that the polarization directions (polarization angles) in the window portions 24A to 24D are θ1 to θ4, respectively, θ1=0 deg, θ2=45 deg, θ3=90 deg, and θ4=135 deg can be satisfied.

Note that polarization portion may be formed by a pattern formed by a plurality of slits (slits) instead of the wires. In a case in which the slits are provided, the polarization direction can be changed by changing the directions of the slits in the window portions 24A to 24D.

Manufacturing of Filter Unit

Disposition of Bandpass Filter

Figure 4:
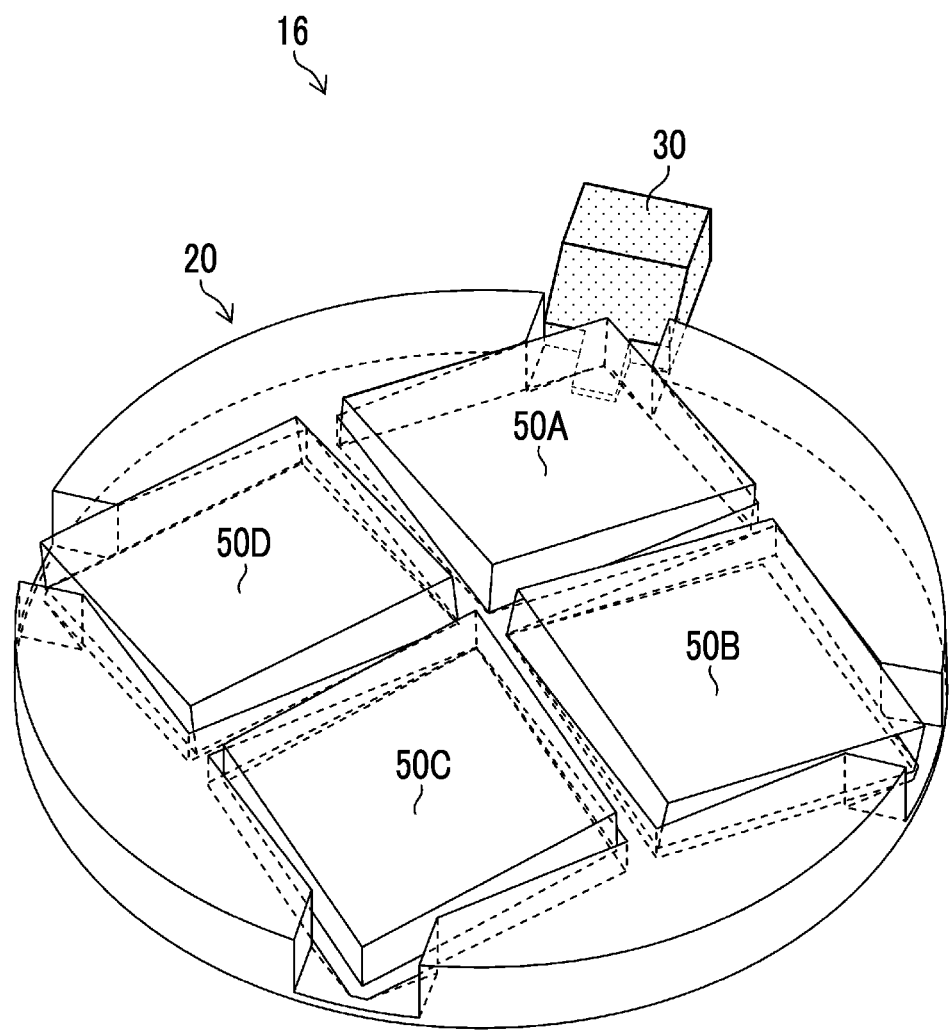
FIG. 4 is a view showing a disposition of a bandpass filter and an inclination adjustment member.

FIG. 4 is a view showing an aspect in which the bandpass filter 50A and the inclination adjustment member 30 (inclination adjustment member) are disposed on the window portion 24A. The bandpass filters 50A to 50D are a plurality of optical filters including two or more optical filters that transmit light beams having at least partially different wavelength ranges, and are disposed in the window portions 24A to 24D, respectively (installation step). Assuming that the transmission wavelength ranges of the bandpass filters 50A to 50D are λ1 to λ4, respectively, for example, λ1 can be a blue wavelength range, λ2 can be a green wavelength range, λ3 can be a red wavelength range, and λ4 can be a near infrared wavelength range. Some of the transmission wavelength ranges may overlap with each other. However, the transmission wavelength range is not limited to this combination, and can be a different wavelength range (or a combination thereof) depending on the spectrum to be imaged.

Pupil Region

Figure 5:
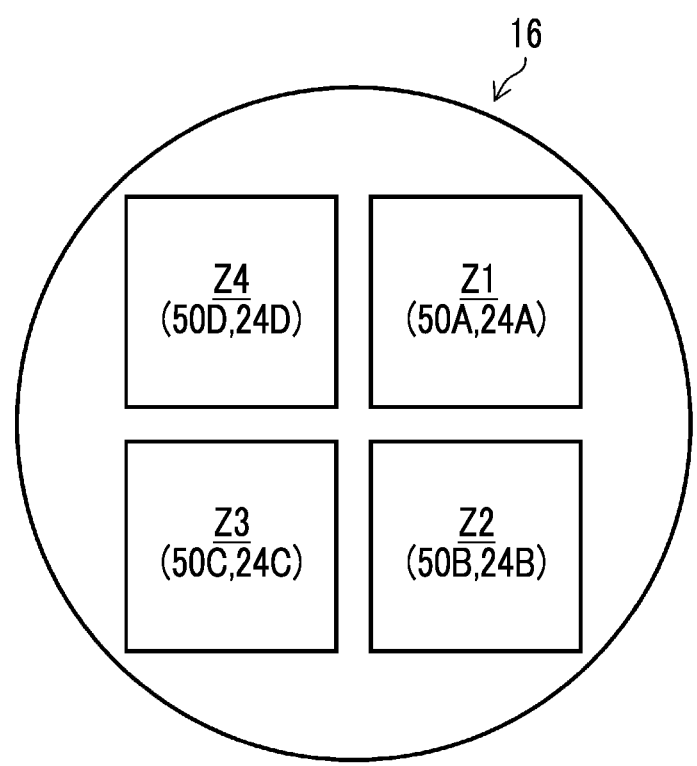
FIG. 5 is a view showing a disposition of a pupil region.

As shown in FIG. 5, the combinations of the window portions and the bandpass filters described above form a plurality of pupil regions Z1 to Z4 having different characteristics. The pupil region Z1 is formed by the bandpass filter 50A and the window portion 24A, and has the polarization direction=θ1 and the wavelength range=λ1. The pupil region Z2 is formed by the bandpass filter 50B and the window portion 24B, and has the polarization direction=θ2 and the wavelength range=λ2. The pupil region Z3 is formed by the bandpass filter 50C and the window portion 24C, and has the polarization direction=θ3 and the wavelength range=λ3. The pupil region Z4 is formed by the bandpass filter 50D and the window portion 24D, and has the polarization direction=θ4 and the wavelength range=λ4.

Adjustment of Inclination by Inclination Adjustment Member

Figure 6A:
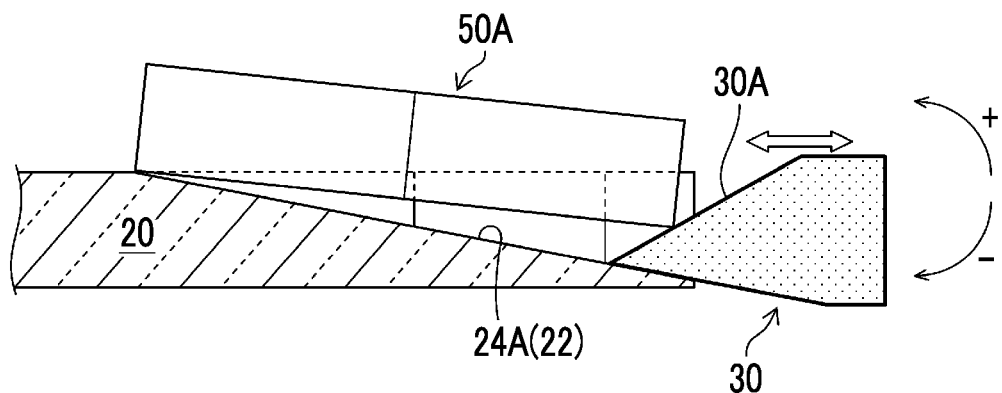
FIGS. 6A to 6C are views each showing an aspect in which an inclination is adjusted.
Figure 6B:
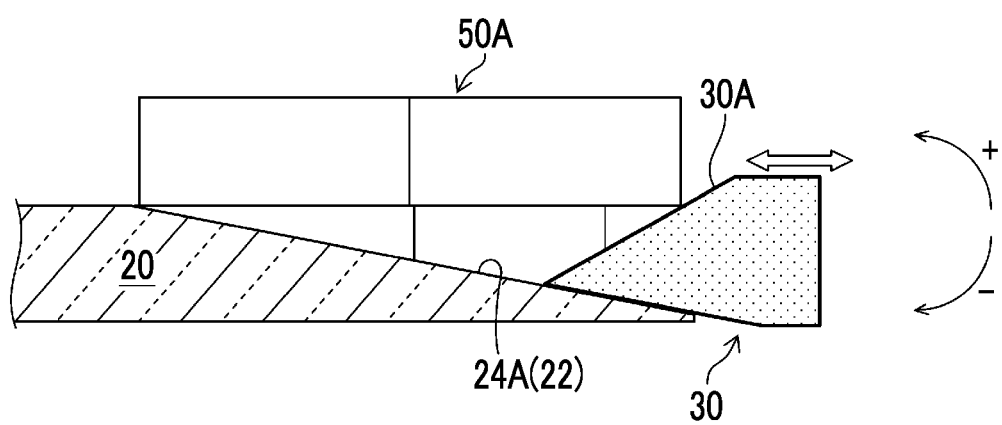
Figure 6C:
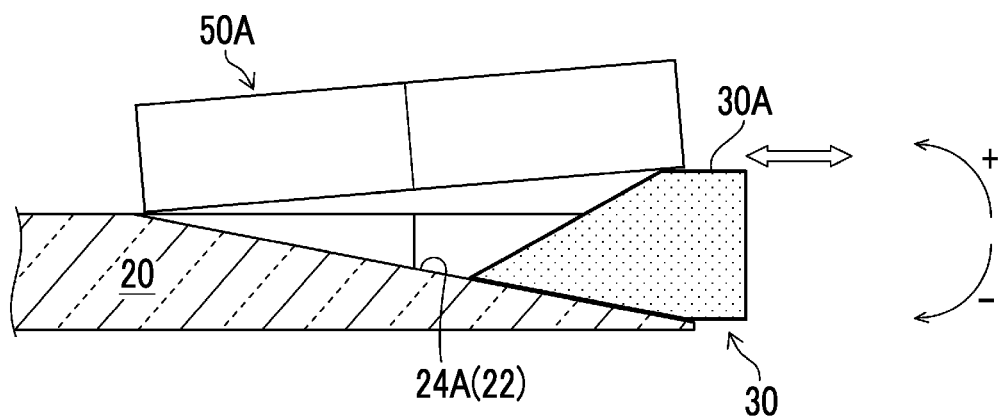

FIGS. 6A to 6C are views each showing an aspect in which the inclination is adjusted. The inclination adjustment member 30 has a contact surface with the bandpass filter 50A as an inclined surface 30A (inclined surface), and the inclination adjustment member 30 is inserted into the insertion port 28 and pushed and pulled in the direction of the arrow (left-right direction in FIGS. 6A to 6C), so that the inclination of the bandpass filter 50A with respect to the inclined surface portion 22 can be easily adjusted (inclination adjustment step). FIG. 6A shows a state in which the inclination angle is negative (the amount of pushing is small), and FIG. 6B shows a state in which the inclination angle is almost 0 deg (the amount of pushing is large) (see the right side of FIGS. 6A to 6C for positive or negative of the angle). In addition, by pushing the inclination adjustment member 30 further than FIG. 6B, the inclination angle can be made positive as in FIG. 6C. In this way, in the filter unit 16, the inclination angles of the bandpass filters 50A to 50D can be adjusted to any one of positive, negative, or zero. The bandpass filters 50A to 50D are adjusted to have the inclination angles corresponding the transmission wavelength ranges of the filters, and are installed on the inclined surface portion 22.

In a case in which the inclination angles are changed due to the adjustment described above, the incidence angles of the light beams with respect to the bandpass filters 50A to 50D are changed, and as a result, the optical path length is changed. In the filter unit 16 (optical element) and the imaging optical system 10 (optical device) according to the first embodiment, the aberration of the imaging optical system 10 is corrected by using the change of the optical path length (described below), and the multispectral image having a good image quality can be acquired.

Note that, in FIGS. 6A to 6C, and subsequent drawings, the bandpass filter 50A will be described as an example for installing the bandpass filter, adjusting the inclination, or fixation, the same can be applied to other bandpass filters 50B to 50D.

Fixing of Bandpass Filter with Fixing Member

In the first embodiment, the adhesive is used as the fixing member that fixes the bandpass filters 50A to 50D (optical filters) to the frame 20. The adhesive fixes the bandpass filters 50A to 50D and the inclination adjustment member 30 to the frame 20, and the portion of the light-receiving regions of the bandpass filters 50A to 50D, which is not covered with the adhesive, forms an aperture (light transmissive region). The adhesive has preferably non-light-transmitting property, but may not have complete non-light-transmitting property. Note that window portion is filled with the adhesive in an amount corresponding to the area of the light transmissive region determined based on the transmission wavelength ranges of the bandpass filters 50A to 50D. Note that area of the light transmissive region can be determined based on conditions, such as the subject, the light source, the transmittance in each wavelength range of the bandpass filter, and the spectral sensitivity characteristics of the imaging element (for example, the area of the transmissive region is widened for the wavelength range having a low "sensitivity" determined by these conditions). Therefore, a filling amount of the adhesive may be different for each bandpass filter (for each window portion).

Figure 7:
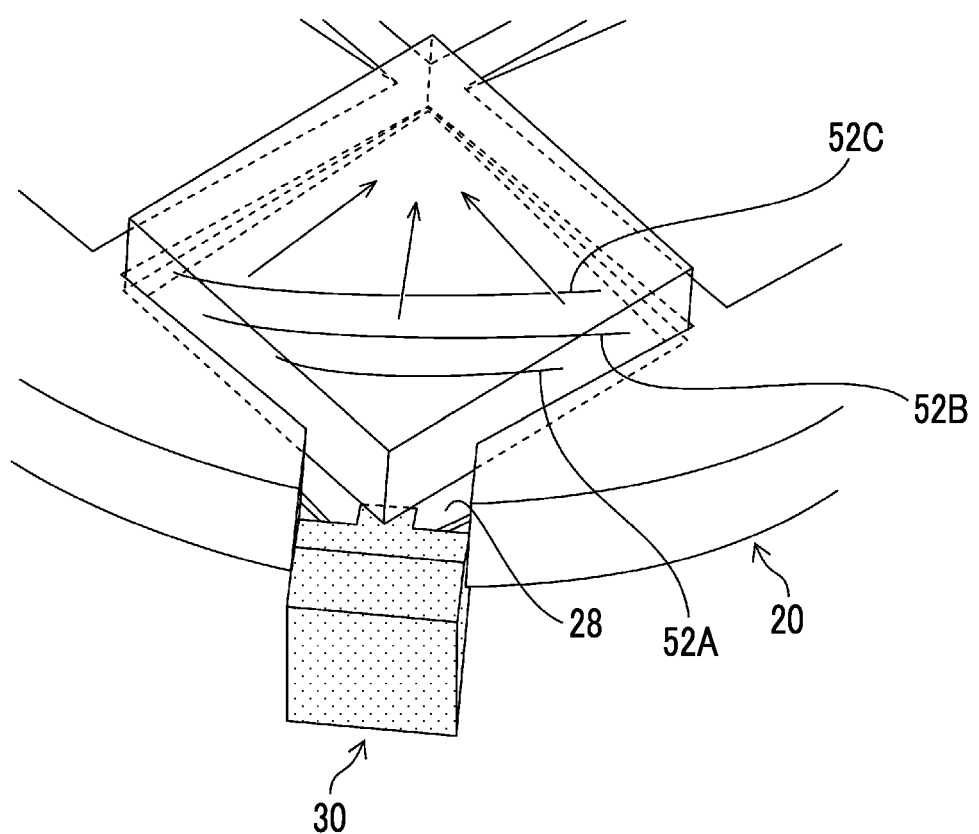
FIG. 7 is a view showing an aspect of filling of an adhesive.
Figure 8A:
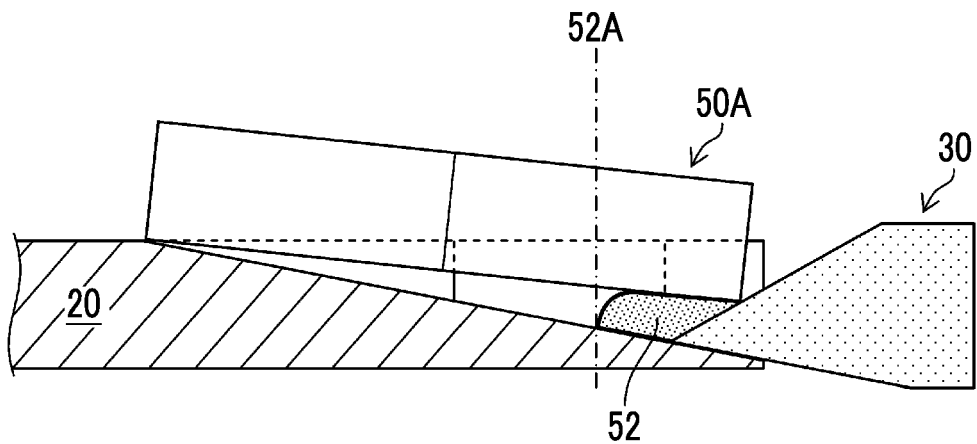
FIGS. 8A to 8C are another views each showing an aspect of filling of the adhesive.
Figure 8B:
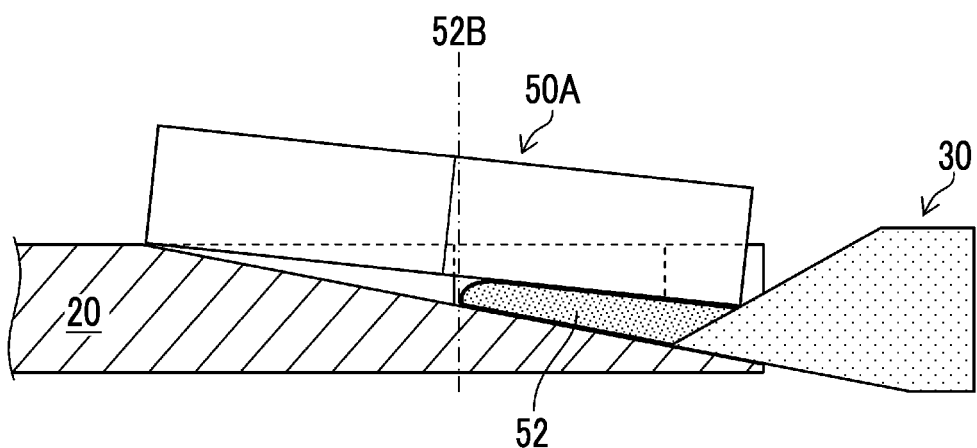
Figure 8C:
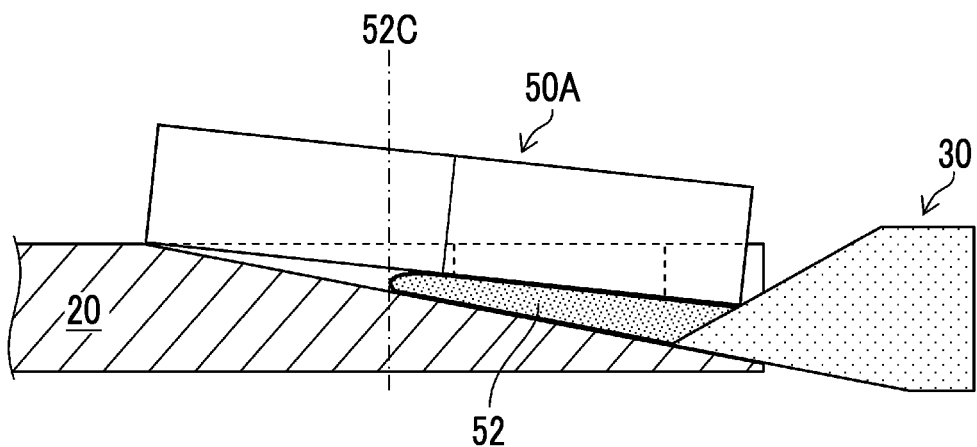

FIG. 7 is a view showing an aspect of the filling of the adhesive. In a state in which the inclination adjustment member 30 pushed into the insertion port 28 to adjust the inclination of the bandpass filter 50A, filling of the adhesive is performed from a gap between the insertion port 28 and the bandpass filter 50A with a syringe, a dropper, or the like (fixation step). The adhesive reaches, for example, a filling line 52A in a state in which the filling amount is small, and reaches filling lines 52B and 52C as the filling amount is increased. FIGS. 8A to 8C are another views each showing an aspect of filling of the adhesive, and shows the adhesive 52 as viewed from a cross-sectional direction of the frame 20. Distal ends of the adhesive 52 (the side close to the center of the frame 20; the left side of FIGS. 8A to 8C) in FIGS. 8A to 8C correspond to the filling lines 52A to 52C in FIG. 7, respectively.

As described above, in the filter unit 16 (optical element) according to the first embodiment, the aperture area can be easily adjusted in a case of assembly by changing the filling amount of the adhesive, and the assembly is easy.

Figure 9:
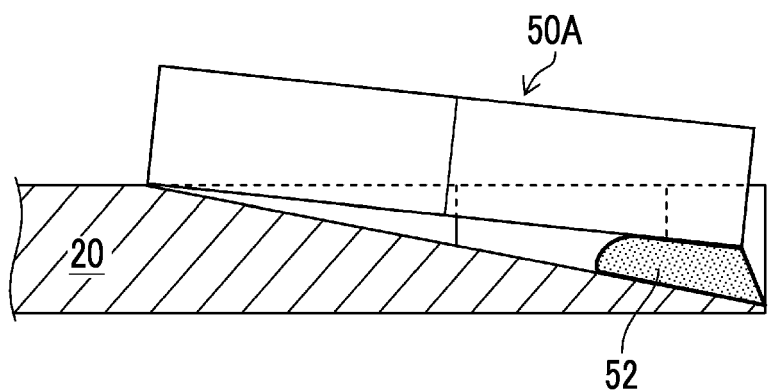
FIG. 9 is a view showing another configuration of a filter unit.

Note that, after the injected adhesive is cured, the inclination adjustment member 30 may be put into a state of being fixed to the frame 20 as shown in FIGS. 8A to 8C, or the inclination adjustment member 30 may be removed as shown in FIG. 9.

Note that installation of the bandpass filters 50A to 50D described above (installation to the window portions 24A to 24D; the installation step), the adjustment of the inclination (pushing and pulling of the inclination adjustment member 30; the inclination adjustment step), or the fixation (injection of the adhesive 52; the fixation step) can be performed by using various machines or devices.

Configuration of Imaging Element

Figure 10:
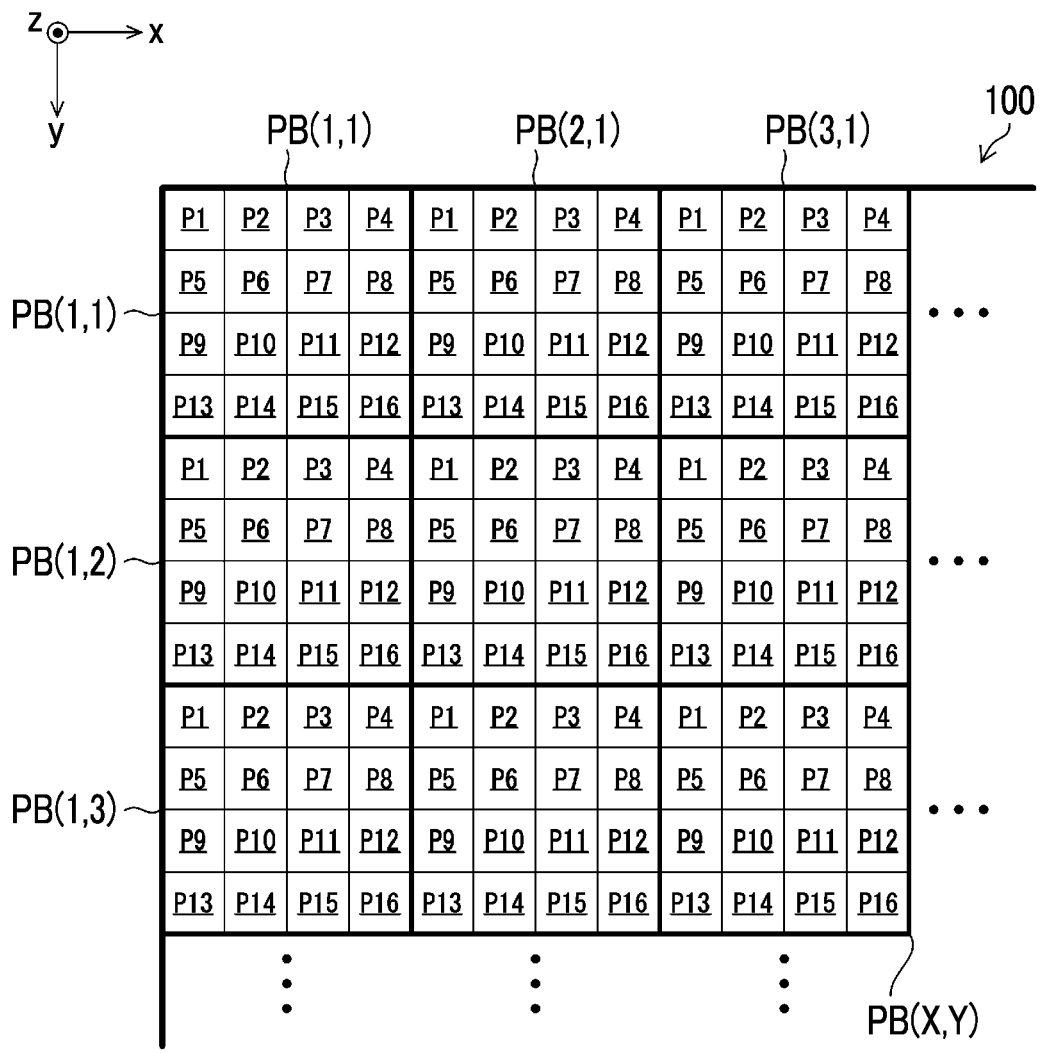
FIG. 10 is a view showing an arrangement of pixels of an imaging element.

FIG. 10 is a view showing a schematic configuration of an arrangement of pixels of the imaging element. As shown in FIG. 10, the imaging element 100 has a plurality of types of pixels (pixel P1 to pixel P16) on a light-receiving surface thereof. These pixel P1 to pixel P16 are regularly arranged at a certain pitch along a horizontal direction (x-axis direction) and a vertical direction (y-axis direction). In the imaging apparatus 1 according to the first embodiment, in the imaging element 100, one pixel block PB (X,Y) is configured by sixteen (4×4) adjacent pixel P1 to pixel P16, and the pixel blocks PB (X,Y) are regularly arranged along the horizontal direction (x-axis direction) and the vertical direction (y-axis direction). (X,Y) indicate positions in the x-axis direction and the y-axis direction, respectively.

Figure 11:
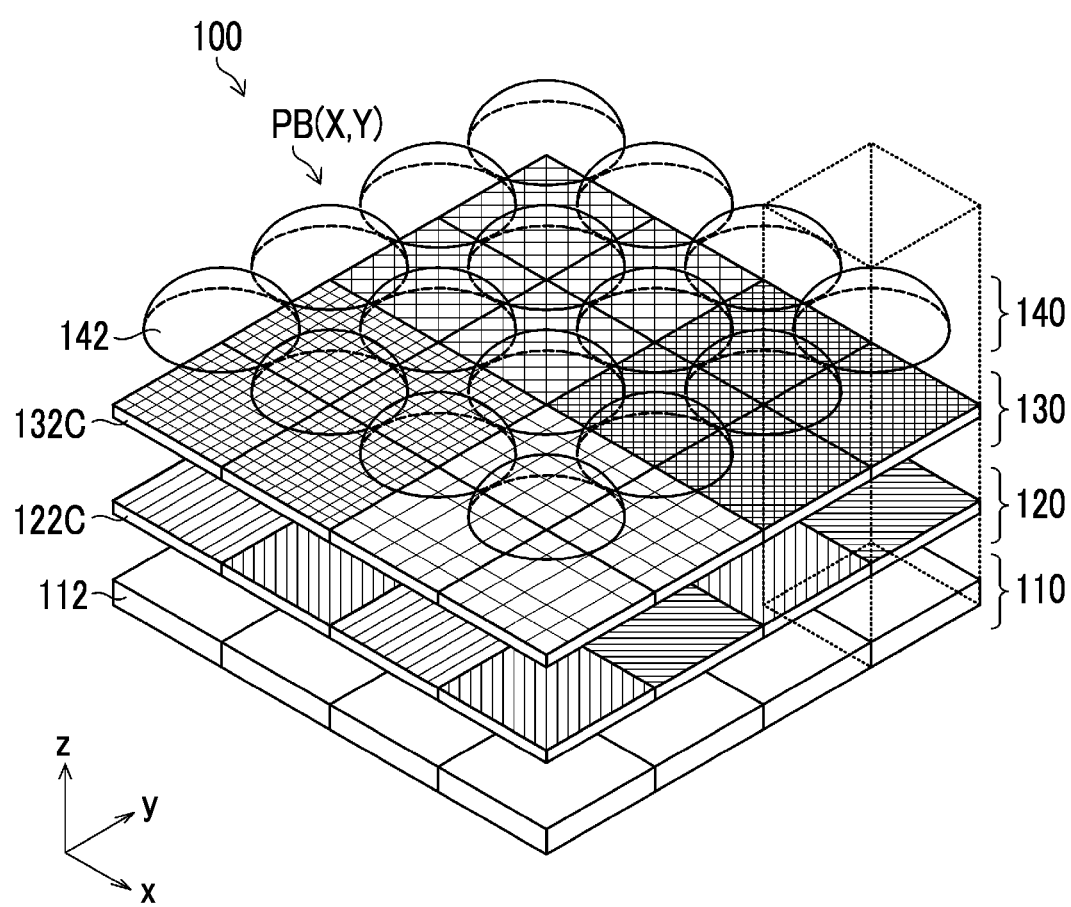
FIG. 11 is a view showing a configuration of the imaging element.
Figure 12:
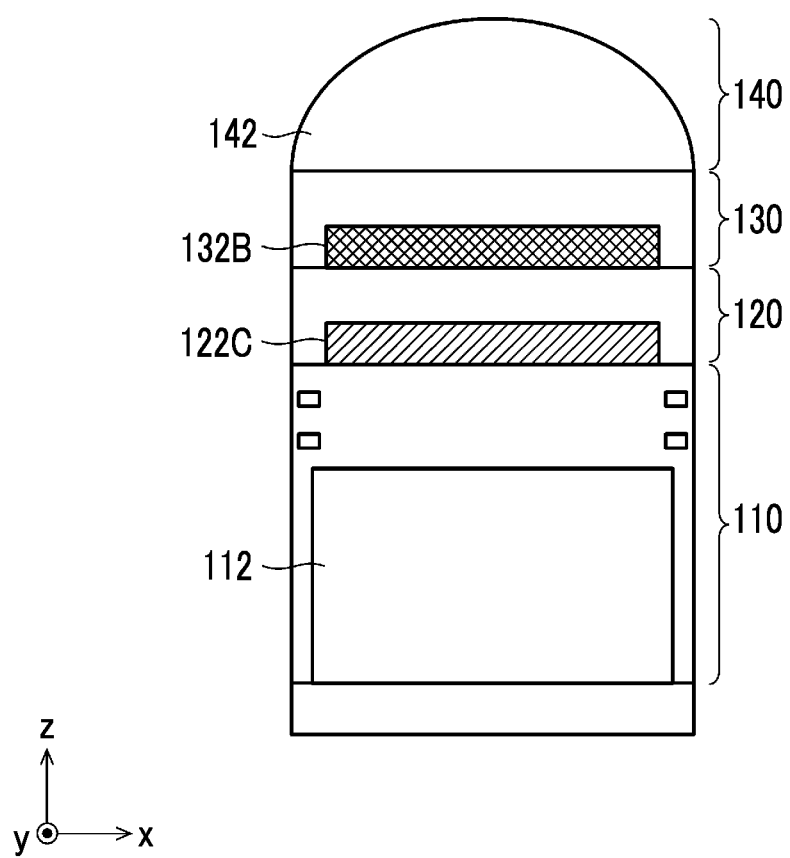
FIG. 12 is a cross-sectional view showing a configuration of the imaging element.

FIG. 11 is a view showing a schematic configuration of the imaging element 100. In addition, FIG. 12 is a cross-sectional view showing a schematic configuration of one pixel (broken line portion in FIG. 11). The imaging element 100 includes a pixel array layer 110, a polarization filter element array layer 120 (polarization portion), a spectral filter element array layer 130 (optical filter), and a micro lens array layer 140. That is, the imaging element 100 comprises a plurality of types of optical filters having different transmission wavelength ranges, and a plurality of types of polarization portions having different polarization directions on a pixel. The layers are disposed in the order of the pixel array layer 110, the polarization filter element array layer 120, the spectral filter element array layer 130, and the micro lens array layer 140 from an image plane side to an object side.

The pixel array layer 110 is configured by two-dimensionally arranging a large number of photodiodes 112. One photodiode 112 configures one pixel. The photodiodes 112 are regularly arranged along the horizontal direction (x-axis direction) and the vertical direction (y-axis direction). The polarization filter element array layer 120 is configured by two-dimensionally arranging four types of the polarization filter elements 122A to 122D having different polarization directions of the transmitted light beams. The polarization filter elements 122A to 122D are arranged at the same intervals as the photodiodes 112, and each of which is provided for each pixel. The polarization filter elements 122A to 122D are regularly arranged in each pixel block PB (X,Y).

Figure 13:
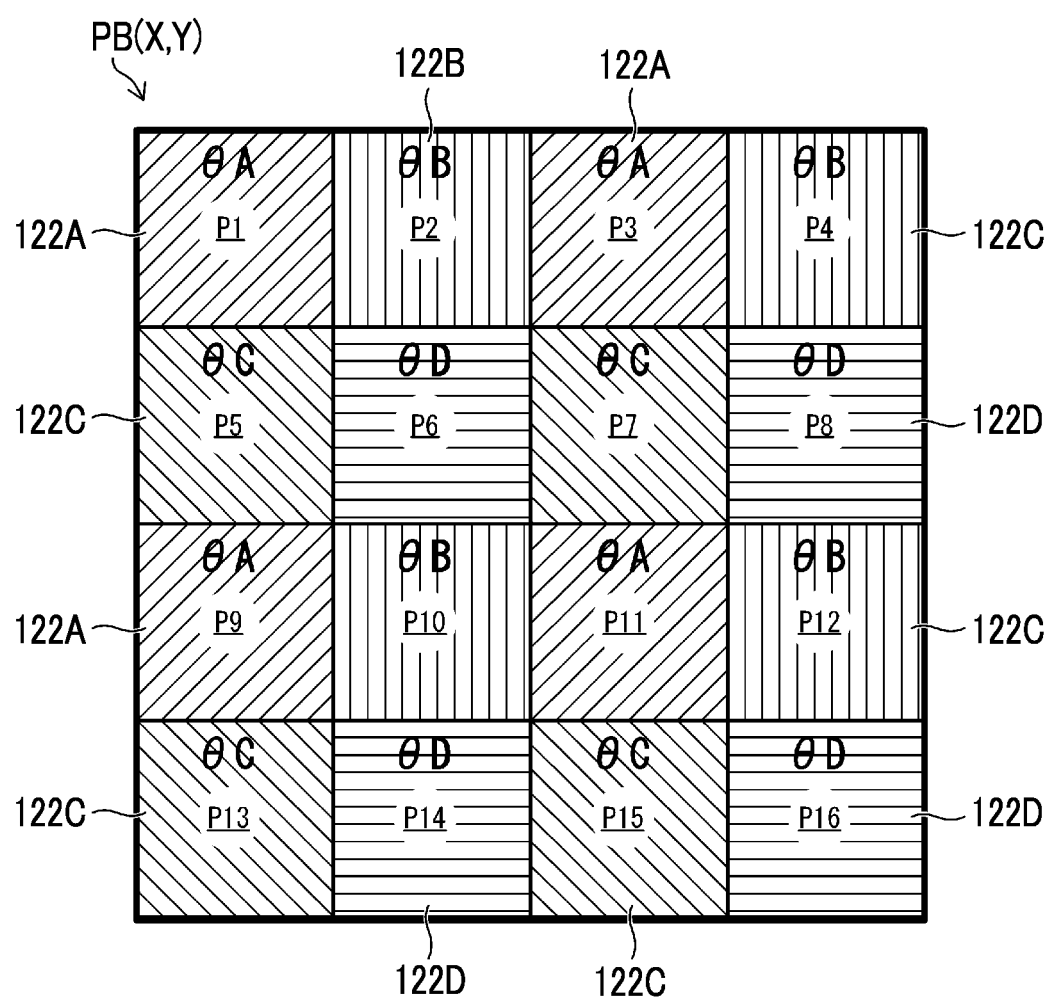
FIG. 13 is a view showing an arrangement pattern of polarization filter elements.

FIG. 13 is a view showing an example of an arrangement pattern of the polarization filter elements in one pixel block. As shown in FIG. 13, in the imaging apparatus 1 according to the first embodiment, the pixel P1, the pixel P3, the pixel P9, and the pixel P11 comprise the polarization filter element 122A. In addition, the pixel P2, the pixel P4, the pixel P10, and the pixel P12 comprise the polarization filter element 122B. In addition, the pixel P3, the pixel P7, the pixel P13, and the pixel P15 comprise the polarization filter element 122C. In addition, the pixel P4, the pixel P8, the pixel P14, and the pixel P16 comprise the polarization filter element 122D.

The polarization filter elements 122A to 122D transmit the light beams of polarization directions different from each other. Specifically, the polarization filter element 122A transmits the light beam of the polarization direction θA (for example, θA=45°). The polarization filter element 122B transmits the light beam of the polarization direction θB (for example, θB=90°). The polarization filter element 122C transmits the light beam of the polarization direction OC (for example, θC=135°). The polarization filter element 122D transmits the light beam of the polarization direction OD (for example, θD=0°).

The spectral filter element array layer 130 is configured by two-dimensionally arranging four types of the spectral filter elements 132A to 132D having different transmission wavelength characteristics. The spectral filter elements 132A to 132D are arranged at the same intervals as the photodiodes 112, and each of which is provided for each pixel. The spectral filter elements 132A to 132D are regularly arranged in each pixel block PB (X,Y).

Figure 14:
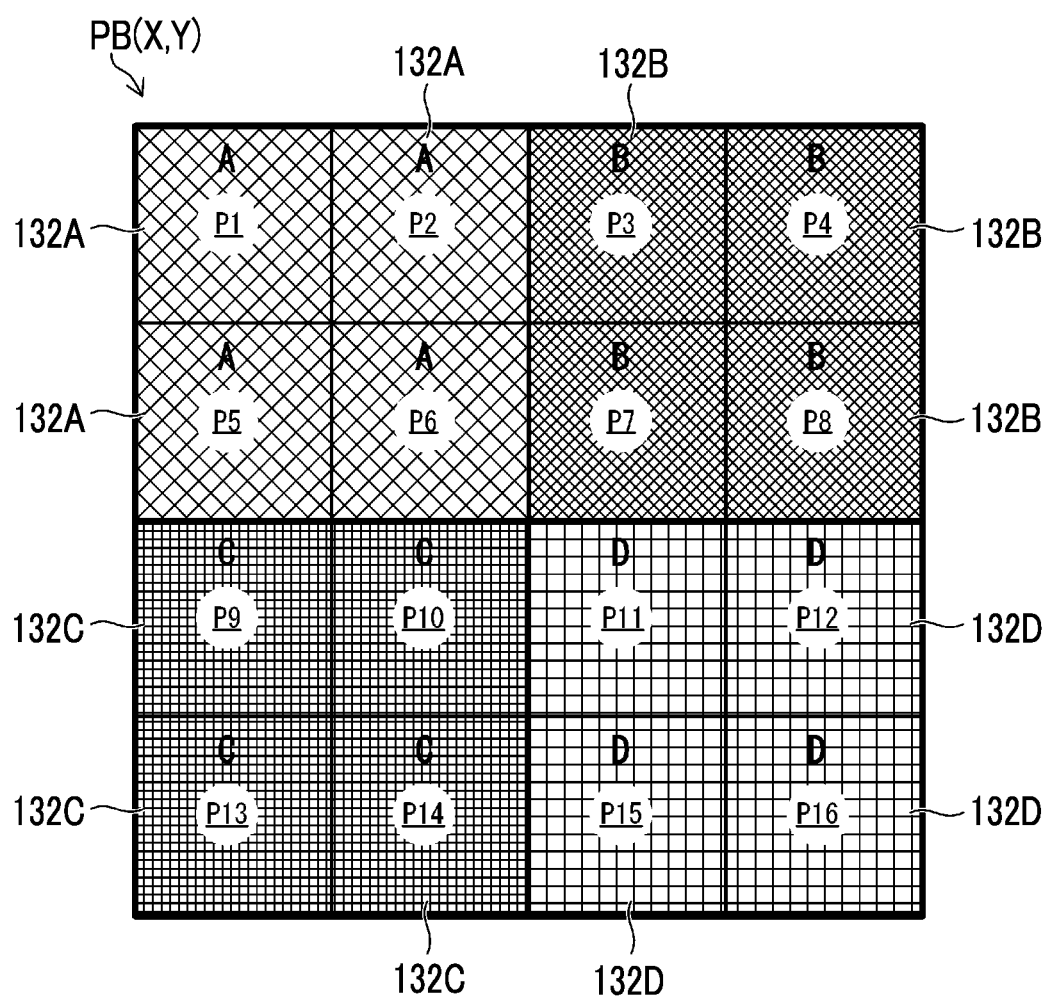
FIG. 14 is a view showing an arrangement pattern of spectral filter elements.

FIG. 14 is a view showing an example of an arrangement pattern of the spectral filter elements in one pixel block. As shown in FIG. 14, in the imaging apparatus 1 according to the first embodiment, the pixel P1, the pixel P2, the pixel P5, and the pixel P6 comprise the spectral filter element 132A. In addition, the pixel P3, the pixel P4, the pixel P7, and the pixel P8 comprise the spectral filter element 132B. In addition, the pixel P9, the pixel P10, the pixel P13, and the pixel P14 comprise the spectral filter element 132C. In addition, the pixel P11, the pixel P12, the pixel P15, and the pixel P16 comprise the spectral filter element 132D.

Figure 15:
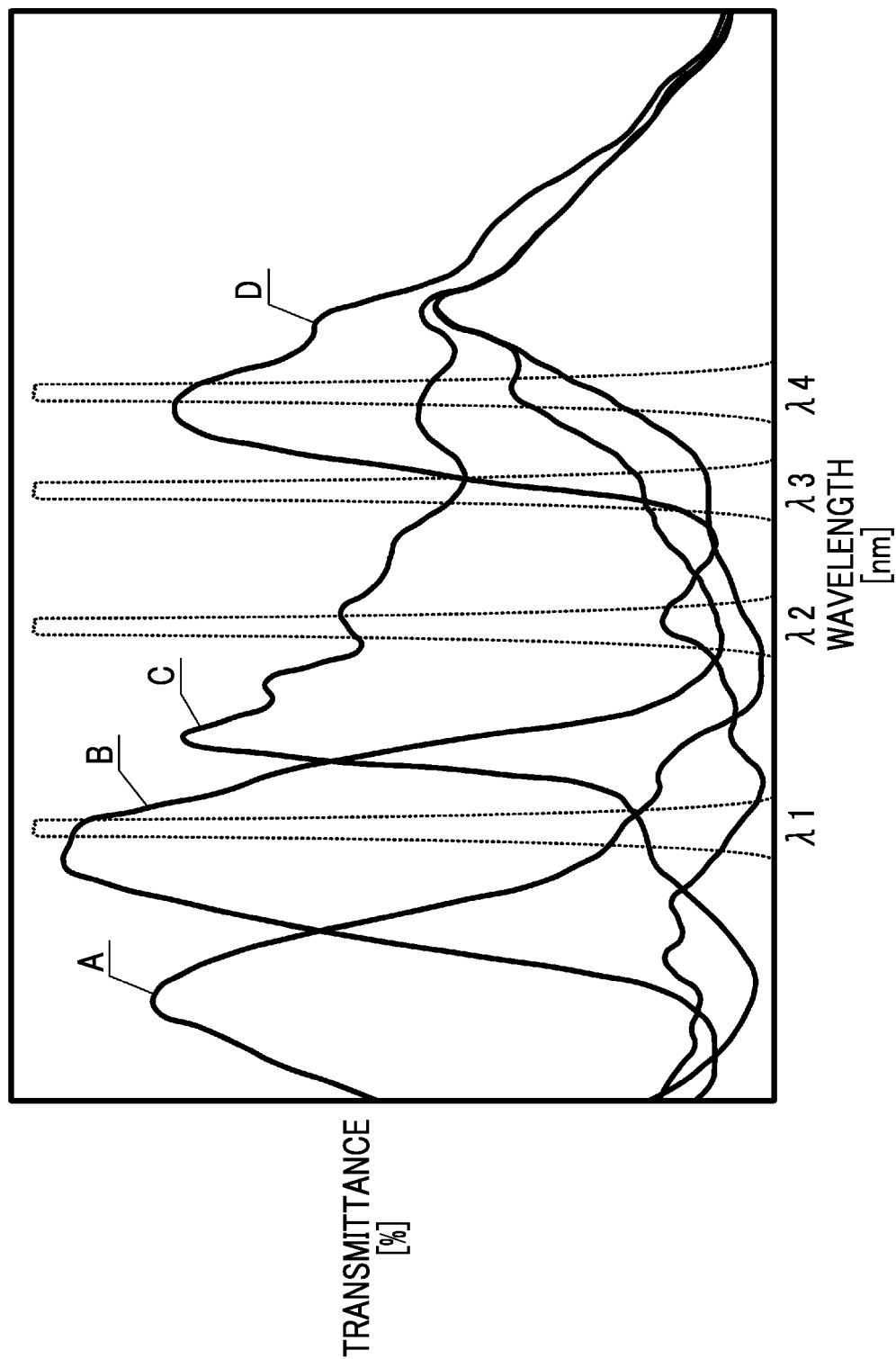
FIG. 15 is a view showing a transmission wavelength characteristic of the spectral filter element.

FIG. 15 is a graph showing an example of the transmission wavelength characteristic of each spectral filter element. In FIG. 15, A shows the transmission wavelength characteristic of the spectral filter element 132A. B shows the transmission wavelength characteristic of the spectral filter element 132B. C shows the transmission wavelength characteristic of the spectral filter element 132C. D shows the transmission wavelength characteristic of the spectral filter element 132D. The spectral filter elements 132A to 132D have transmission wavelength characteristics different from each other. Note that FIG. 15 shows an example in a case in which the spectral filter element 132A is configured by the spectral filter element which transmits a blue (B) light beam, the spectral filter element 132B is configured by the spectral filter element which transmits a green (G) light beam, the spectral filter element 132C is configured by the spectral filter element which transmits a red (R) light beam, and the spectral filter element 132D is configured by the spectral filter element which transmits an infrared (IR) light beam.

Here, as shown in FIG. 15, the wavelength ranges λ1 to λ4 of the light beams transmitted through the bandpass filters 50A to 50D described above are set within ranges of transmission wavelength ranges of the spectral filter elements 132A to 132D. That is, the wavelength ranges λ1 to λ4 of the light beams transmitted through the bandpass filters 50A to 50D are set in the regions of which the transmission wavelength ranges of the spectral filter elements 132A to 132D overlap with each other. Stated another way, the transmission wavelength ranges of the spectral filter elements 132A to 132D are set so as to cover the transmission wavelength ranges of the bandpass filters 50A to 50D. Therefore, each of the spectral filter elements 132A to 132D uses a filter which transmits a light beam of a wide range.

The micro lens array layer 140 is configured by two-dimensionally arranging a large number of micro lenses 142. The micro lenses 142 are arranged at the same intervals as the photodiodes 112, and each of which is provided for each pixel. The micro lenses 142 are provided for a purpose of efficiently condensing the light beams from the imaging optical system 10 on the photodiodes 112.

In the imaging element 100 configured as described above, in each pixel block PB (X,Y), each of the pixels P1 to P16 receives the light beam from the imaging optical system 10 as follows.

That is, the pixel P1 receives the light beams from the imaging optical system 10 via the spectral filter element 132A (transmission wavelength characteristic A) and the polarization filter element 122A (polarization direction θA). In addition, the pixel P2 receives the light beams from the imaging optical system 10 via the spectral filter element 132A (transmission wavelength characteristic A) and the polarization filter element 122B (polarization direction θB). In addition, the pixel P3 receives the light beams from the imaging optical system 10 via the spectral filter element 132B (transmission wavelength characteristic B) and the polarization filter element 122A (polarization direction θA). In addition, the pixel P4 receives the light beams from the imaging optical system 10 via the spectral filter element 132B (transmission wavelength characteristic B) and the polarization filter element 122B (polarization direction θB). In addition, the pixel P5 receives the light beams from the imaging optical system 10 via the spectral filter element 132A (transmission wavelength characteristic A) and the polarization filter element 122C (polarization direction θC). In addition, the pixel P6 receives the light beams from the imaging optical system 10 via the spectral filter element 132A (transmission wavelength characteristic A) and the polarization filter element 122D (polarization direction θD). In addition, the pixel P7 receives the light beams from the imaging optical system 10 via the spectral filter element 132B (transmission wavelength characteristic B) and the polarization filter element 122C (polarization direction θC). In addition, the pixel P8 receives the light beams from the imaging optical system 10 via the spectral filter element 132B (transmission wavelength characteristic B) and the polarization filter element 122D (polarization direction θD). In addition, the pixel P9 receives the light beams from the imaging optical system 10 via the spectral filter element 132C (transmission wavelength characteristic C) and the polarization filter element 122A (polarization direction θA). In addition, the pixel P10 receives the light beams from the imaging optical system 10 via the spectral filter element 132C (transmission wavelength characteristic C) and the polarization filter element 122B (polarization direction θB). In addition, the pixel P11 receives the light beams from the imaging optical system 10 via the spectral filter element 132D (transmission wavelength characteristic D) and the polarization filter element 122A (polarization direction θA). In addition, the pixel P12 receives the light beams from the imaging optical system 10 via the spectral filter element 132D (transmission wavelength characteristic D) and the polarization filter element 122B (polarization direction θB). In addition, the pixel P13 receives the light beams from the imaging optical system 10 via the spectral filter element 132C (transmission wavelength characteristic C) and the polarization filter element 122C (polarization direction θC). In addition, the pixel P14 receives the light beams from the imaging optical system 10 via the spectral filter element 132C (transmission wavelength characteristic C) and the polarization filter element 122D (polarization direction θD). In addition, the pixel P15 receives the light beams from the imaging optical system 10 via the spectral filter element 132D (transmission wavelength characteristic D) and the polarization filter element 122C (polarization direction θC). In addition, the pixel P16 receives the light beams from the imaging optical system 10 via the spectral filter element 132D (transmission wavelength characteristic D) and the polarization filter element 122D (polarization direction θD).

In this way, the pixels P1 to P16 receive the light beams having different characteristics, respectively, by having different optical characteristics (wavelength ranges and polarization directions) from each other. That is, the pixels P1 to P16 constitute a plurality of pixel groups that selectively receive the light beam transmitted through any of the bandpass filters 50A to 50D (plurality of optical filters) by the spectral filter elements and the polarization filter elements.

Configuration of Signal Processing Unit

The signal processing unit 200 (signal processing unit) processes the signals output from the imaging element 100 to generate image data of the multispectral image of four bands. That is, image data of four types of wavelength ranges λ1 to λ4 (a plurality of images corresponding to the wavelength ranges of the plurality of optical filters) transmitted through the filter unit 16 described above are generated.

Figure 16:
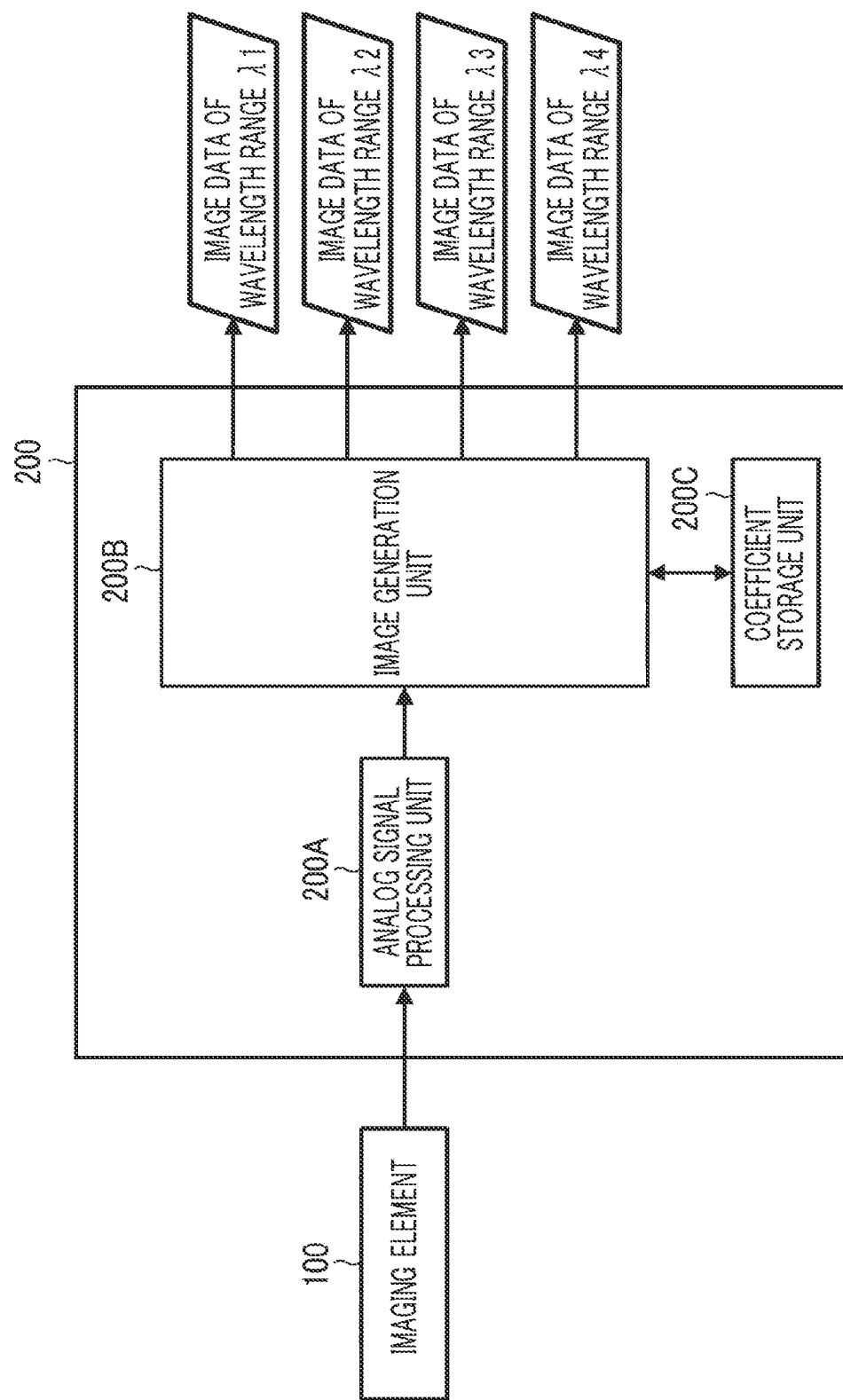
FIG. 16 is a block view showing a schematic configuration of a signal processing unit.

FIG. 16 is a block view showing a schematic configuration of the signal processing unit. As shown in FIG. 16, the signal processing unit 200 includes an analog signal processing unit 200A, an image generation unit 200B, and a coefficient storage unit 200C. The analog signal processing unit 200A takes in an analog pixel signal output from each pixel of the imaging element 100, performs signal processing (for example, sampling two correlation pile processing, amplification processing, and the like), converts the processed pixel signal into a digital signal, and the outputs the converted digital signal. The image generation unit 200B performs signal processing on the pixel signal after being converted into the digital signal to generate the image data of each of the wavelength ranges (λ1 to λ4).

Figure 17:
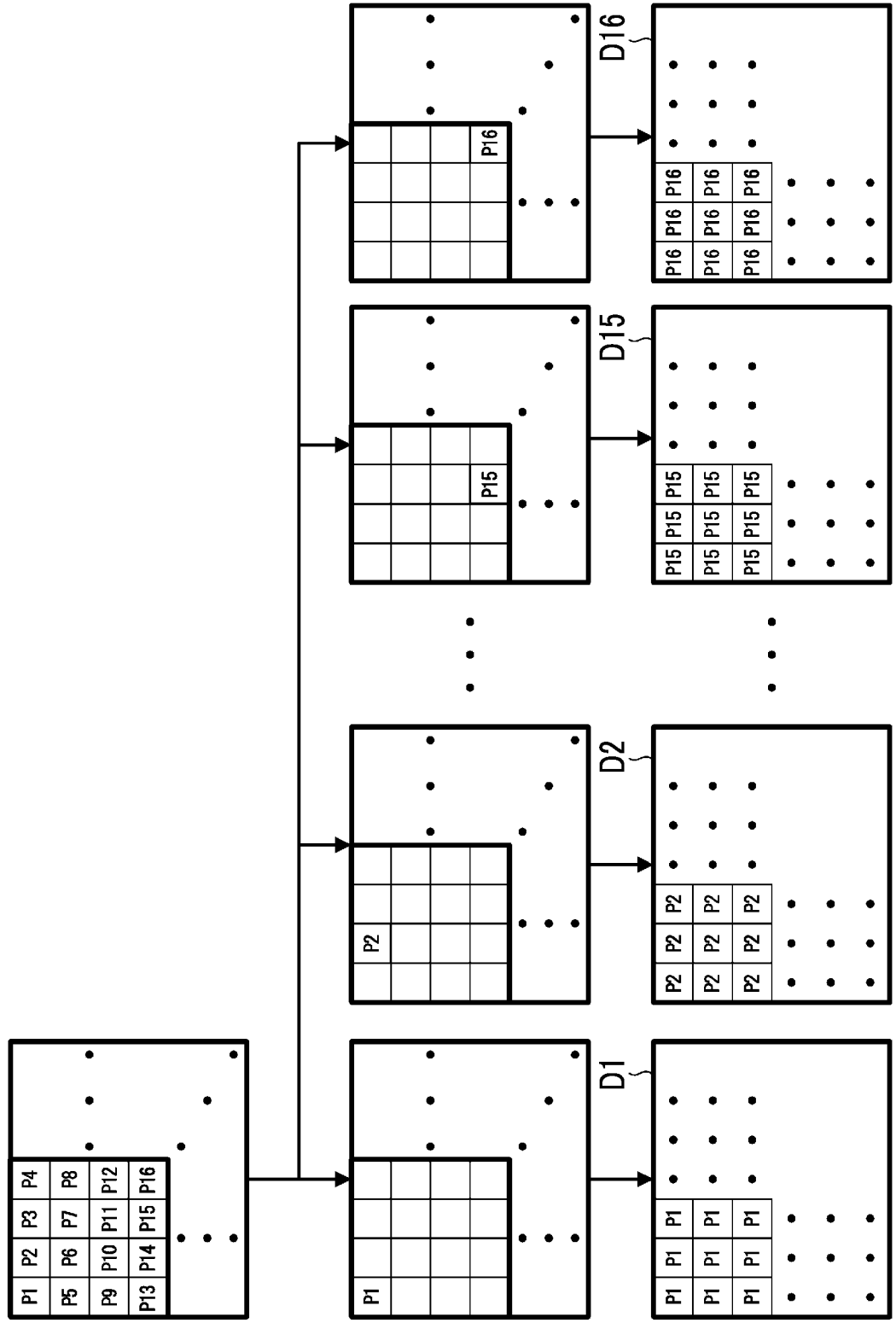
FIG. 17 is a conceptual view of image generation.

FIG. 17 is a conceptual view of image generation. Each pixel block PB (X,Y) includes sixteen pixels P1 to P16, as described above. Therefore, sixteen image data D1 to D16 are generated by separating and extracting the pixel signals of the pixels P1 to P16 from each pixel block PB (X,Y). However, interference (crosstalk) has occurred in these sixteen image data D1 to D16. That is, since the light beam of each wavelength range is incident on each of the pixels P1 to P16, the generated image is an image in which images of the wavelength ranges are mixed. Therefore, the image generation unit 200B performs interference removal processing to generate the image data of each of the wavelength ranges (λ1 to λ4).

Hereinafter, the interference removal processing performed by the signal processing unit 200 will be described.

The pixel signal (signal value) obtained by the pixel P1 of each pixel block PB (X,Y) is defined as α1, and the pixel signals obtained by the pixels P2 to P16 are referred to as α2 to α16, respectively, in the same manner. Then, from each pixel block PB (X,Y), the sixteen pixel signals α1 to α16 can be obtained. The image generation unit 200B calculates the four pixel signals β1 to β4 corresponding to the light beams of the wavelength ranges λ1 to λ4 from the sixteen pixel signals α1 to α16, and removes interference. Specifically, the image generation unit 200B calculates the four pixel signals β1 to β4 corresponding to the light beams of the wavelength ranges λ1 to λ4 are calculated by Equation 1 using the following matrix A, and removes the interference.

The interference occurs by the light beam of each of the wavelength ranges λ1 to λ4 mixed into each of the pixels P1 to P16. A ratio (interference ratio) at which the light beam of each of the wavelength ranges λ1 to λ4 emitted from the imaging optical system 10 is received by each of the pixels P1 to P16 is bij (i=1 to 16, j=1 to 4). For example, b11 is a ratio of the light beam of the wavelength range λ1 received by the pixel P1, b12 is a ratio of the light beam of the wavelength range λ2 received by the pixel P1, b13 is a ratio of the light beam of the wavelength range λ3 received by the pixel P1, and b14 is a ratio of the light beam of the wavelength range λ4 received by the pixel P1. In the following, b21 to b164 are defined below in the same manner. This ratio bij (b11 to b164) can be determined in advance by unique determination from setting of the wavelength ranges λ1 to λ4 of the light beams transmitted through the bandpass filters 50A to 50D of the filter unit 16, setting of the polarization directions θ1 to θ4 of the light beams transmitted by the window portions 24A to 24D, $$A = \begin{bmatrix} a11 & a12 & a13 & a14 & a15 & a16 & a17 & a18 & a19 & a110 & a111 & a112 & a113 & a114 & a115 & a116 \\ a21 & a22 & a23 & a24 & a25 & a26 & a27 & a28 & a29 & a210 & a211 & a212 & a213 & a214 & a215 & a216 \\ a31 & a32 & a33 & a34 & a35 & a36 & a37 & a38 & a39 & a310 & a311 & a312 & a313 & a314 & a315 & a316 \\ a41 & a42 & a43 & a44 & a45 & a46 & a47 & a48 & a49 & a410 & a411 & a412 & a413 & a414 & a415 & a416 \end{bmatrix}$$

Equation 1

$$\begin{bmatrix} \beta1 \\ \beta2 \\ \beta3 \\ \beta4 \end{bmatrix} = \begin{bmatrix} a11 & a12 & a13 & a14 & a15 & a16 & a17 & a18 & a19 & a110 & a111 & a112 & a113 & a114 & a115 & a116 \\ a21 & a22 & a23 & a24 & a25 & a26 & a27 & a28 & a29 & a210 & a211 & a212 & a213 & a214 & a215 & a216 \\ a31 & a32 & a33 & a34 & a35 & a36 & a37 & a38 & a39 & a310 & a311 & a312 & a313 & a314 & a315 & a316 \\ a41 & a42 & a43 & a44 & a45 & a46 & a47 & a48 & a49 & a410 & a411 & a412 & a413 & a414 & a415 & a416 \end{bmatrix} * \begin{bmatrix} \alpha1 \\ \alpha2 \\ \alpha3 \\ \alpha4 \\ \alpha5 \\ \alpha6 \\ \alpha7 \\ \alpha8 \\ \alpha9 \\ \alpha10 \\ \alpha11 \\ \alpha12 \\ \alpha13 \\ \alpha14 \\ \alpha15 \\ \alpha16 \end{bmatrix}$$

Note that the pixel signal β1 is the pixel signal corresponding to the light beam of the wavelength range λ1, the pixel signal β32 is the pixel signal corresponding to the light beam of the wavelength range λ2, the pixel signal β3 is the pixel signal corresponding to the light beam of the wavelength range λ3, and the pixel signal β4 is the pixel signal corresponding to the light beam of the wavelength range λ4. Therefore, the image data of the wavelength range λ1 is generated from the pixel signal β1, the image data of the wavelength range λ2 is generated from the pixel signal β2, the image data of the wavelength range λ3 is generated from the pixel signal β3, and the image data of the wavelength range λ4 is generated from the pixel signal ⊕4. Hereinafter, the reason why the interference can be removed by Equation 1 will be described.

setting of the transmission wavelength characteristics A to D (see FIG. 15) of each of the pixels P1 to P16 of the imaging element 100, and setting of the polarization directions θA to θC (see FIG. 13) of the light beams received by the pixels P1 to P16 of the imaging element 100.

The following relationship is satisfied between the pixel signals α1 to α16 obtained by the pixels P1 to P16 of each pixel block PB (X,Y) and the pixel signals β1 to β4 corresponding to the light beams of the wavelength ranges λ1 to λ4.

Regarding the pixel signal α1 obtained by the pixel P1, "b11*β1+b12*β2+b13*β3+b14*β4=α1 . . . Equation 2" is satisfied ("*" is a symbol of integration).

Regarding the pixel signal α2 obtained by the pixel P2, "b21*β1+b22*β2+b23*β3+b24*β4=α2 ... Equation 3" is satisfied.

Regarding the pixel signal α3 obtained by the pixel P3, "b31*β1+b32*β2+b33*β3+b34*β4=α3 ... Equation 4" is satisfied.

Regarding the pixel signal α4 obtained by the pixel P4, "b41*β1+b42*β2+b43*β3+b44*β4=α4 ... Equation 5" is satisfied.

Regarding the pixel signal α5 obtained by the pixel P5, "b51*β1+b52*β2+b53*β3+b54*β4=α5 ... Equation 6" is satisfied.

Regarding the pixel signal α6 obtained by the pixel P6, "b61*β1+b62*β2+b63*β3+b64*β4=α6 ... Equation 7" is satisfied.

Regarding the pixel signal α7 obtained by the pixel P7, "b71*β1+b72*β2+b73*β3+b74*β4=α7 ... Equation 8" is satisfied.

Regarding the pixel signal α8 obtained by the pixel P8, "b81*β1+b82*β2+b83*β3+b84*β4=α8 ... Equation 9" is satisfied.

Regarding the pixel signal α9 obtained by the pixel P9, "b91*β1+b92*β2+b93*β3+b94*β4=α9 ... Equation 10" is satisfied.

Regarding the pixel signal α10 obtained by the pixel P10, "b101*β1+b102*β2+b103*β3+b104*β4=α10 ... Equation 11" is satisfied.

Regarding the pixel signal α11 obtained by the pixel P11, "b111*β1+b112*β2+b113*β3+b114*β4=α11 ... Equation 12" is satisfied.

Regarding the pixel signal α12 obtained by the pixel P12, "b121*β1+b122*β2+b123*β3+b124*β4=α12 ... Equation 13" is satisfied.

Regarding the pixel signal α13 obtained by the pixel P13, "b131*β1+b132*β2+b133*β3+b134*β4=α13 ... Equation 14" is satisfied.

Regarding the pixel signal α14 obtained by the pixel P14, "b141*β1+b142*β2+b143*β3+b144*β4=α14 ... Equation 15" is satisfied.

Regarding the pixel signal α15 obtained by the pixel P15, "b151*β1+b152*β2+b153*β3+b154*β4=α15 ... Equation 16" is satisfied.

Regarding the pixel signal α16 obtained by the pixel P16, "b161*β1+b162*β2+b163*β3+b164*β4=α16 ... Equation 17" is satisfied.

Here, the simultaneous equations of Equations 2 to 17 can be expressed by Equation 18 using a matrix B.

$$B = \begin{bmatrix} b11 & b12 & b13 & b14 \\ b21 & b22 & b23 & b24 \\ b31 & b32 & b33 & b34 \\ b41 & b42 & b43 & b44 \\ b51 & b52 & b53 & b54 \\ b61 & b62 & b63 & b64 \\ b71 & b72 & b73 & b74 \\ b81 & b82 & b83 & b84 \\ b91 & b92 & b93 & b94 \\ b101 & b102 & b103 & b104 \\ b111 & b112 & b113 & b114 \\ b121 & b122 & b123 & b124 \\ b131 & b132 & b133 & b134 \\ b141 & b142 & b143 & b144 \\ b151 & b152 & b153 & b154 \\ b161 & b162 & b163 & b164 \end{bmatrix} \quad \text{Equation 18}$$

$$\begin{bmatrix} b11 & b12 & b13 & b14 \\ b21 & b22 & b23 & b24 \\ b31 & b32 & b33 & b34 \\ b41 & b42 & b43 & b44 \\ b51 & b52 & b53 & b54 \\ b61 & b62 & b63 & b64 \\ b71 & b72 & b73 & b74 \\ b81 & b82 & b83 & b84 \\ b91 & b92 & b93 & b94 \\ b101 & b102 & b103 & b104 \\ b111 & b112 & b113 & b114 \\ b121 & b122 & b123 & b124 \\ b131 & b132 & b133 & b134 \\ b141 & b142 & b143 & b144 \\ b151 & b152 & b153 & b154 \\ b161 & b162 & b163 & b164 \end{bmatrix} * \begin{bmatrix} \beta1 \\ \beta2 \\ \beta3 \\ \beta4 \end{bmatrix} = \begin{bmatrix} \alpha1 \\ \alpha2 \\ \alpha3 \\ \alpha4 \\ \alpha5 \\ \alpha6 \\ \alpha7 \\ \alpha8 \\ \alpha9 \\ \alpha10 \\ \alpha11 \\ \alpha12 \\ \alpha13 \\ \alpha14 \\ \alpha15 \\ \alpha16 \end{bmatrix}$$

β1 to β4, which are the solutions of the simultaneous equations of Equations 2 to 17, are calculated by multiplying both sides of Equation 18 by an inverse matrix $B^{-1}$ of the matrix B.

$$\begin{bmatrix} \beta1 \\ \beta2 \\ \beta3 \\ \beta4 \end{bmatrix} = \begin{bmatrix} b11 & b12 & b13 & b14 \\ b21 & b22 & b23 & b24 \\ b31 & b32 & b33 & b34 \\ b41 & b42 & b43 & b44 \\ b51 & b52 & b53 & b54 \\ b61 & b62 & b63 & b64 \\ b71 & b72 & b73 & b74 \\ b81 & b82 & b83 & b84 \\ b91 & b92 & b93 & b94 \\ b101 & b102 & b103 & b104 \\ b111 & b112 & b113 & b114 \\ b121 & b122 & b123 & b124 \\ b131 & b132 & b133 & b134 \\ b141 & b142 & b143 & b144 \\ b151 & b152 & b153 & b154 \\ b161 & b162 & b163 & b164 \end{bmatrix}^{-1} * \begin{bmatrix} \alpha1 \\ \alpha2 \\ \alpha3 \\ \alpha4 \\ \alpha5 \\ \alpha6 \\ \alpha7 \\ \alpha8 \\ \alpha9 \\ \alpha10 \\ \alpha11 \\ \alpha12 \\ \alpha13 \\ \alpha14 \\ \alpha15 \\ \alpha16 \end{bmatrix} \quad \text{Equation 19}$$

In this way, the pixel signals β1 to β4 corresponding to the wavelength ranges λ1 to λ4 can be calculated from the signal values (pixel signals α1 to α16) of the pixels P1 to P16 based on the ratio in which the light beam of the wavelength ranges λ1 to λ4 emitted from the imaging optical system 10 received by the pixels P1 to P16 of the pixel block PB (X,Y).

In Equation 1, the inverse matrix $B^{-1}$ of Equation 19 is set to A ($B^{-1}$=A). Therefore, elements aij of the matrix A in Equation 1 can be acquired by obtaining the inverse matrix $B^{-1}$ of the matrix B.

The coefficient storage unit 200C stores the elements aij of the matrix A for performing the interference removal processing, as a coefficient group.

The image generation unit 200B acquires the coefficient group from the coefficient storage unit 200C, calculates the pixel signals β1 to β4 corresponding to the wavelength ranges λ1 to λ4 by Equation 1 from the pixel signals α1 to α6 obtained from the pixels P1 to P16 of each pixel block PB (X,Y), and generates the image data of the wavelength ranges λ1 to λ4.

The image data of the wavelength ranges λ1 to λ4 generated by the image generation unit 200B are output to the outside and stored in a storage device (not shown), as needed. In addition, the image signals thereof are displayed on a display (not shown), as needed.

Image Generation

Figure 18:
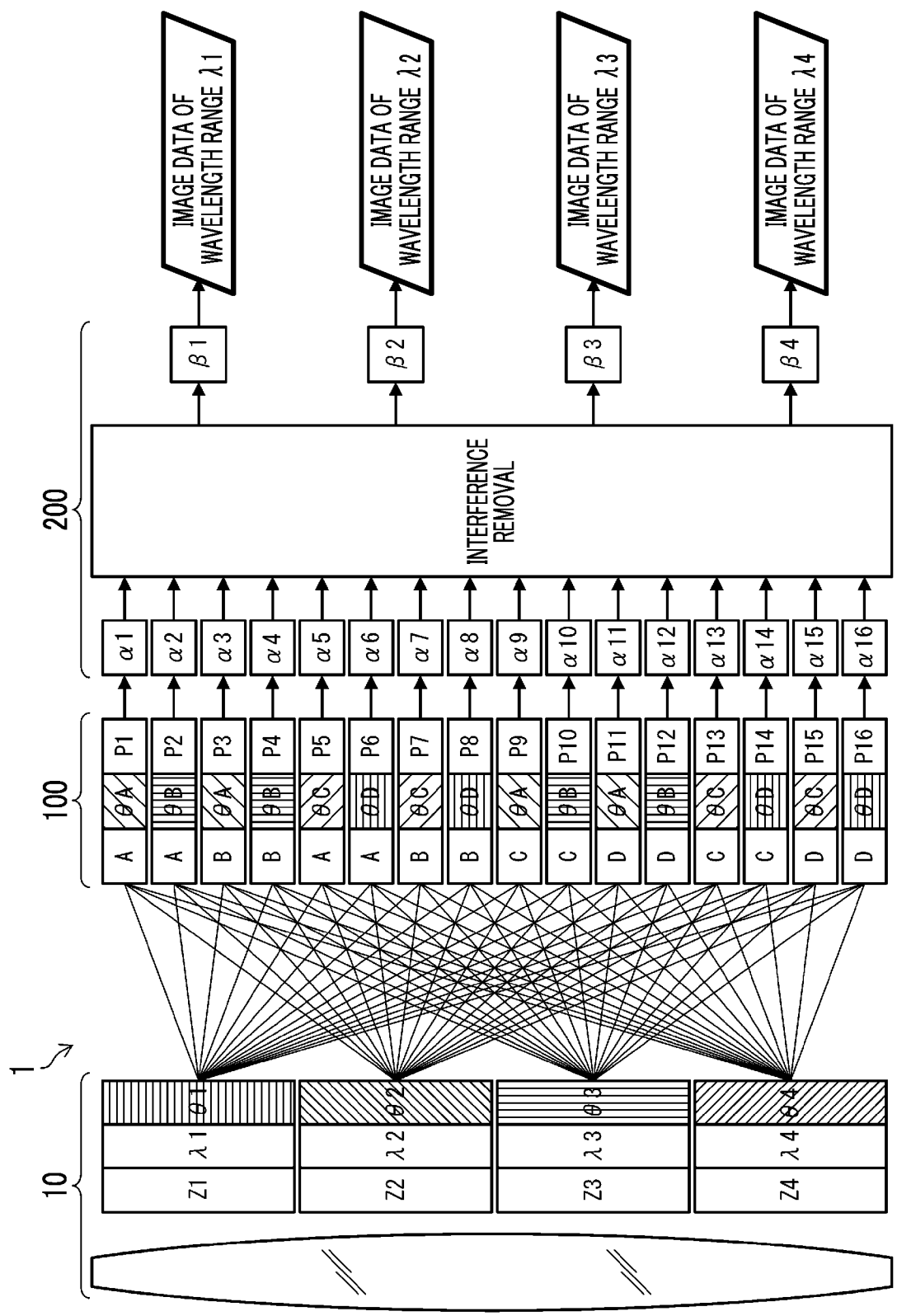
FIG. 18 is a conceptual view of the image generation by the imaging apparatus.

FIG. 18 is a conceptual view of the image generation by the imaging apparatus 1.

The light beams incident on the imaging optical system 10 become four types of the light beams having different characteristics, which are incident on the imaging element 100. Specifically, the light beams become the light beam (first light beam) of the polarization direction θ1 and the wavelength range 1, the light beam (second light beam) of the polarization direction θ2 and the wavelength range λ2, the light beam (third light beam) of the polarization direction θ3 and the wavelength range λ3, and the light beam (fourth light beam) of the polarization direction θ4 and the wavelength range λ4, which are incident on the imaging element 100.

In each pixel block PB (X,Y) of the imaging element 100, the light beam of each of the wavelength ranges emitted from the imaging optical system 10 is received in each of the pixels P1 to P16 at the ratio bij described above. That is, the light beam of each of the wavelength ranges λ1 to λ4 is received at the ratio bij by the actions of the polarization filter elements 122A to 122D and the spectral filter elements 132A to 132D provided in each of the pixels P1 to P16.

The signal processing unit 200 calculates the pixel signals β1 to β4 corresponding to the light beams of the wavelength ranges λ1 to λ4 from the pixel signals α1 to α16 obtained from the pixels P1 to P16 of each pixel block PB (X,Y) of the imaging element 100, and generates the image data of the wavelength ranges λ1 to λ4. That is, the signal processing unit 200 performs arithmetic processing (interference removal processing) by Equation 1 using the matrix A, calculates the pixel signals β1 to β4 corresponding to the light beam of the wavelength ranges λ1 to λ4 from the pixel signals α1 to α16 of the pixels P1 to P16 obtained from the imaging element 100, and generates the image data of the wavelength ranges λ1 to λ4.

In this way, with the imaging apparatus 1 according to the first embodiment, the image of four types of different wavelength ranges (multispectral image of four bands) can be captured by using one imaging optical system 10 and one (single plate) imaging element 100.

Aberration Correction of Imaging Optical System

In a general imaging optical system, the aberration differs for each wavelength. Therefore, even in a case in which the pupil splitting is simply performed in the general imaging optical system to be used for imaging, the multispectral image having a good image quality cannot be obtained. Note that the "general imaging optical system" here means an imaging optical system in which the aberration for each wavelength is not particularly corrected, that is, an imaging optical system in which the aberration for each wavelength remains.

In addition, in WO2014/020791A described above, multispectral imaging is possible by using a polarization sensor and pupil splitting, but the aberration of the lens is not discussed, and an ideal lens is assumed. Therefore, in a case in which a general lens having the aberration is applied to the system of WO2014/020791A, unexpected aberration may occur and the resolution performance may be deteriorated. On the other hand, in order to design a dedicated lens for the system of WO2014/020791A and suppress the aberration, there are restrictions on the number of lenses or size thereof, the type of glass used, and the like.

In contrast to such a related art, the imaging apparatus 1 according to the first embodiment captures the multispectral image by splitting the pupil region of the imaging optical system 10 into a plurality of regions (pupil regions Z1 to Z4) (pupil splitting) and limiting the wavelength range in each region (transmitting the light beams having a specific wavelength range). In addition, in the imaging apparatus 1 according to the first embodiment, the bandpass filters 50A to 50D have the functions of individually correcting the aberrations of the regions corresponding to the pupil regions Z1 to Z4. Specifically, by adjusting the inclination of each of the bandpass filters 50A to 50D, individually, an optical path length of the light beam transmitted through each of the pupil regions Z1 to Z4 is individually adjusted to correct the aberration. For example, by adjusting the optical path length, the imaging position of the light beam transmitted through each of the pupil regions Z1 to Z4 is moved back and forth on the optical axis L, so that the axial chromatic aberration is corrected. As a result, in the imaging optical system 10, the aberration characteristics of the regions corresponding to the pupil regions Z1 to Z4 are different from each other.

With the imaging apparatus 1 according to the first embodiment, the aberration of the region corresponding to each of the pupil regions Z1 to Z4 can be individually controlled, so that the aberration can be controlled for each wavelength. As a result, a good resolution can be acquired even with a general lens having the aberration, and the multispectral image having a good image quality can be captured.

Modification Example

A modification example of the imaging apparatus 1 according to the first embodiment described above will be described.

Modification Example of Inclination Adjustment Member

Figure 19A:
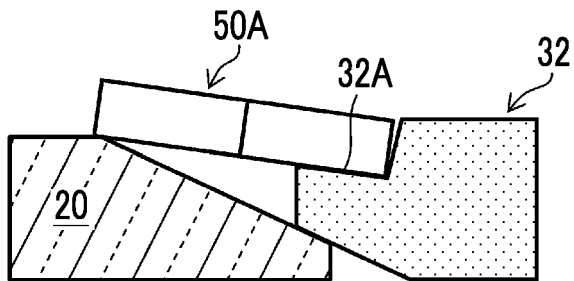
FIGS. 19A and 19B are views each showing another aspect of the inclination adjustment member.
Figure 19B:
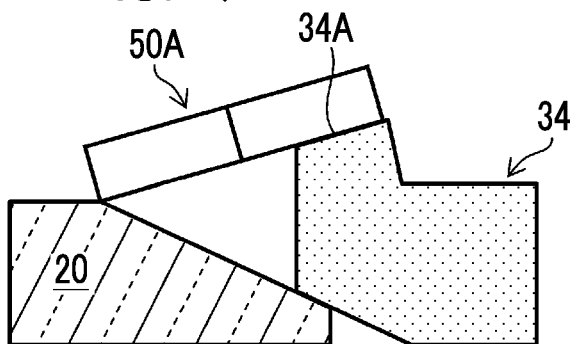

FIGS. 19A and 19B are views each showing a modification example of the inclination adjustment member. In the examples shown in FIGS. 4 and 6A to 8C, the angle is adjusted by pushing and pulling the inclination adjustment member 30 having a single shape, whereas in the example shown in FIGS. 19A and 19B, a plurality of inclination adjustment members having different shapes are prepared and used properly, so that the angle to be adjusted is limited. In addition, inclination adjustment members 32 and 34 shown in FIGS. 19A and 19B are provided with inclined surfaces 32A and 34A, respectively, and these inclined surfaces 32A and 34A come into surface contact with the bandpass filter 50A, so that the posture of the bandpass filter 50A is stabilized. Note that of such a surface contact, a plurality of protrusions (for example, three points) may be formed on the inclination adjustment member to bring the protrusions into contact with the bandpass filter.

Modification Example of Frame and Fixing Member

Figure 20A:
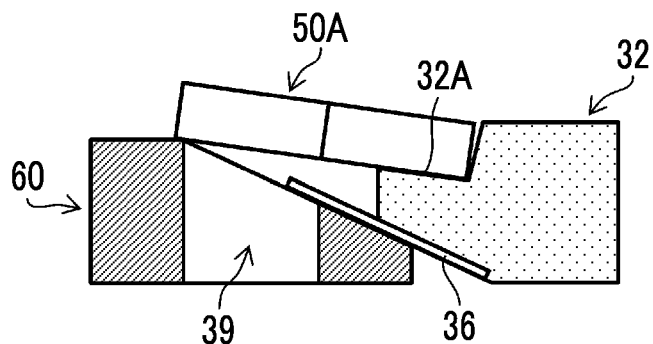
FIGS. 20A and 20B are views each showing another aspect of the filter unit.
Figure 20B:
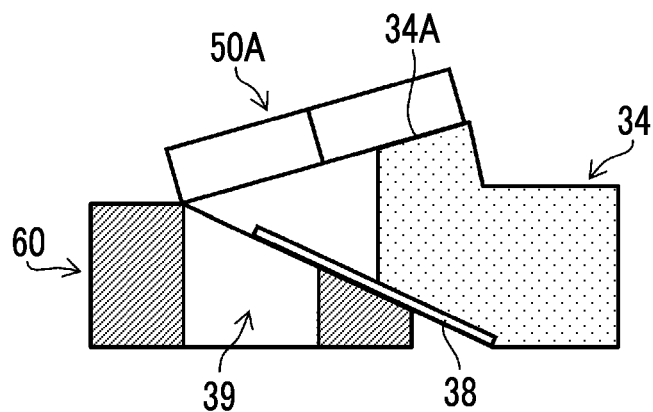

FIGS. 20A and 20B are views showing modification examples of the frame and the fixing member (only one side of the frame is shown). In the example shown in FIGS. 20A and 20B, in a frame 60, a portion on which the bandpass filters 50A to 50D are installed is an aperture 39 (aperture). An aperture area of the aperture 39 can be adjusted by preparing and using a plurality of aperture area adjustment members (having a non-light-transmitting property) having different shapes. Specifically, in the examples shown in FIGS. 20A and 20B, aperture area adjustment members 36 and 38 having different shapes are used, respectively, and the aperture area of the aperture 39 is changed by these the aperture area adjustment members 36 and 38. These aperture area adjustment members 36 and 38 can be fixed to other members by using the adhesive having a light-transmitting property or a non-light-transmitting property. Note that the example shown in FIGS. 20A and 20B, the frame 60 may have a light-transmitting property or a non-light-transmitting property. In addition, the polarization filter can be laminated on the bandpass filters 50A to 50D to form the polarization portion (see FIG. 22).

Another Modification Example of Inclination Adjustment Member

Figure 21A:
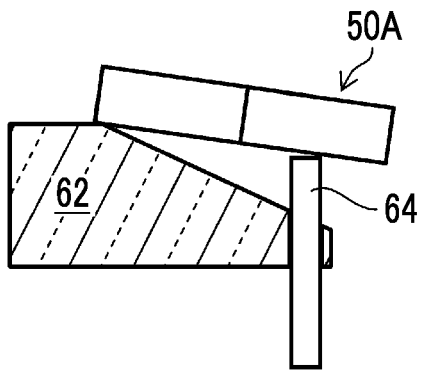
FIGS. 21A and 21B are views each showing adjustment of the inclination by pushing and pulling a rod-like member.
Figure 21B:
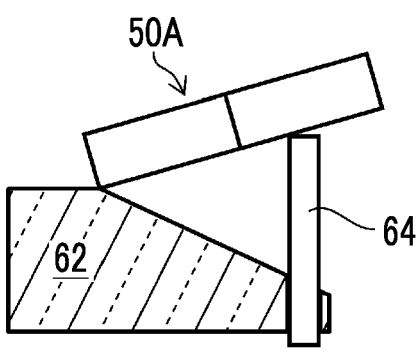

FIGS. 21A and 21B are views each showing another modification example of the inclination adjustment member (only one side of the frame is shown). In the example shown in FIGS. 21A and 21B, by pushing and pulling a rod-like member 64 (inclination adjustment member) inserted into a through hole formed in the frame 62 in the direction of the optical axis L2, as shown in FIGS. 21A and 21B, the inclination of the bandpass filter 50A with respect to the window portion 24A (inclined surface portion 22) can be adjusted.

Modification Example of Polarization Portion

Figure 22:
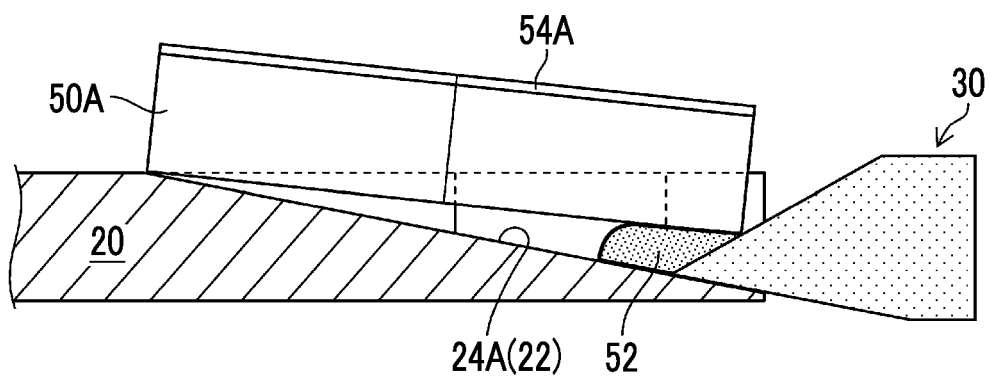
FIG. 22 is a view showing another aspect of the polarization portion.

FIG. 22 is a view showing a modification example of the polarization portion (only one side of the frame is shown). In the first embodiment, the polarization portion (see FIG. 3 and the like) is formed by using the wire grid or the slit, but in the example shown in FIG. 22, a polarization filter 54A is laminated on the bandpass filter 50A to form the polarization portion for the window portion 24A. Note that, as in a case of using the wire grid or the slit, the polarization directions are different for the bandpass filters 50A to 50D.

Modification Example of Number of Wavelength Ranges and Polarization Directions Although a case has been described in which the filter unit 16 corresponds to four wavelength ranges and four polarization directions in the first embodiment, the wavelength ranges and the polarization directions may be different numbers. For example, by blocking or omitting any of the bandpass filters 50A to 50D (for example, the bandpass filter 50D), it is possible to make the filter unit 16 to correspond to three wavelength ranges (any two of the bandpass filters 50A to 50C may be installed). In addition, by making the direction of the polarization film 40 the same in the two window portions (for example, θ1=0 deg, θ2=45 deg, θ3=90 deg, and θ4=90 deg), it is possible to make the filter unit 16 to correspond to three polarization directions. In addition, three wavelength ranges and three polarization directions may be realized by shielding any of the window portions 24A to 24D. Moreover, three window portions may be formed on the frame.

Modification Example of Configuration of Imaging Element

The imaging element may be a color imaging element having the spectral filter element array layer as in the first embodiment, or may be a monochrome imaging element having no spectral filter element array layer. The combination of the number of wavelength ranges and the number of polarization directions of the optical filter, and the number of spectra and the number of polarization directions of the imaging element can be determined depending on "wavelength of the image to be acquired (the number of spectra of the image to be acquired)".

Other Configurations for Selective Light Reception

Instead of the selective light reception using the polarization filter as in the first embodiment, the selective light reception may be realized by other means. For example, an aspect can be adopted in which a micro lens is provided for each pixel, a light-blocking mask with a partial opening is provided on the light-receiving surface of the imaging element, and the mask receives the light beam transmitted through any of the pupil regions and blocks the light beams transmitted through other pupil regions.

Other Modification Examples

In the first embodiment, the inclined surface portion 22, the window portions 24A to 24D, and the bandpass filters 50A to 50D have a rectangular shape, but other shapes, such as a polygonal shape, a circular shape, and a fan shape, other than the rectangular shape, may be used. In addition, in the first embodiment and the modification example, the light amount of each wavelength range is adjusted by adjusting the aperture area, but the light amount may be adjusted by using a light dimming filter, such as a neutral density (ND) filter. In this case, a light dimming degree of the ND filter may be changed depending on the wavelength range.

Although the embodiment of the present invention and other examples have been described above, it is needless to say that the present invention is not limited to the aspect described above, and various modifications can be made without departing from the gist of the present invention.

EXPLANATION OF REFERENCES

1: imaging apparatus
10: imaging optical system
12: lens
16: filter unit
20: frame
21: optical axis center
22: inclined surface portion
24A: window portion
24B: window portion
24C: window portion
24D: window portion
26: wall portion
28: insertion port
30: inclination adjustment member
30A: inclined surface 32: inclination adjustment member
32A: inclined surface
34: inclination adjustment member
34A: inclined surface
36: aperture area adjustment member
38: aperture area adjustment member
39: aperture
40: polarization film
42: wire
50A: bandpass filter
50B: bandpass filter
50C: bandpass filter
50D: bandpass filter
52: adhesive
52A: filling line
52B: filling line
52C: filling line
54A: polarization filter
62: frame
64: rod-like member
100: imaging element
110: pixel array layer
112: photodiode
120: polarization filter element array layer
122A: polarization filter element
122B: polarization filter element
122C: polarization filter element
122D: polarization filter element
130: spectral filter element array layer
132A: spectral filter element
132B: spectral filter element
132C: spectral filter element
132D: spectral filter element
140: micro lens array layer
142: micro lens
200: signal processing unit
200A: analog signal processing unit
200B: image generation unit
200C: coefficient storage unit
A: transmission wavelength characteristic
B: transmission wavelength characteristic
C: transmission wavelength characteristic
D: transmission wavelength characteristic
D1: image data
D2: image data
D3: image data
D4: image data
D5: image data
D6: image data
D7: image data
D8: image data
D9: image data
D10: image data
D11: image data
D12: image data
D13: image data
D14: image data
D15: image data
D16: image data
L: optical axis
L2: optical axis
P1: pixel
P2: pixel
P3: pixel
P4: pixel
P5: pixel
P6: pixel
P7: pixel
P8: pixel
P9: pixel
P10: pixel
P11: pixel
P12: pixel
P13: pixel
P14: pixel
P15: pixel
P16: pixel
PB: pixel block
Z1: pupil region
Z2: pupil region
Z3: pupil region
Z4: pupil region
$\alpha 1$: pixel signal
$\alpha 2$: pixel signal
$\alpha 3$: pixel signal
$\alpha 4$: pixel signal
$\alpha 5$: pixel signal
$\alpha 6$: pixel signal
$\alpha 7$: pixel signal
$\alpha 8$: pixel signal
$\alpha 9$: pixel signal
$\alpha 10$: pixel signal
$\alpha 11$: pixel signal
$\alpha 12$: pixel signal
$\alpha 13$: pixel signal
$\alpha 14$: pixel signal
$\alpha 15$: pixel signal
$\alpha 16$: pixel signal
$\beta 1$: pixel signal
$\beta 2$: pixel signal
$\beta 3$: pixel signal
$\beta 4$: pixel signal
$\theta 1$: polarization direction
$\theta 2$: polarization direction
$\theta 3$: polarization direction
$\theta 4$: polarization direction
$\theta A$: polarization direction
$\theta B$: polarization direction
$\theta C$: polarization direction
$\theta D$: polarization direction
$\lambda 1$: wavelength range
$\lambda 2$: wavelength range
$\lambda 3$: wavelength range
$\lambda 4$: wavelength range

What is claimed is:

1. An optical element comprising:
a plurality of optical filters including two or more optical filters that transmit light beams having at least partially different wavelength ranges,
wherein an imaging element includes a plurality of pixel groups that selectively receive a light beam transmitted through any of the plurality of optical filters;
a frame having an inclined surface portion with an optical axis center as an apex, in which the plurality of optical filters are installed on the inclined surface portion; and
an inclination adjustment member that adjusts inclinations of the plurality of optical filters with respect to the inclined surface portion.

2. The optical element according to claim 1, wherein the frame has a plurality of the inclined surface portions.

3. The optical element according to claim 1, further comprising:
a fixing member that fixes the optical filters and the frame.

4. The optical element according to claim 3,
wherein the fixing member is an adhesive,
the plurality of optical filters are fixed to the frame with the adhesive, and
a portion of light-receiving regions of the plurality of optical filters, which is not covered with the adhesive, forms a light transmissive region.

5. The optical element according to claim 4,
wherein a plurality of window portions are filled with the adhesive in an amount corresponding to an area of the light transmissive region determined based on the wavelength ranges of the plurality of optical filters.

6. The optical element according to claim 1,
wherein a contact surface of the inclination adjustment member with the plurality of optical filters is an inclined surface.

7. The optical element according to claim 1,
wherein the inclination adjustment member is fixed to the frame.

8. The optical element according to claim 1,
wherein a plurality of window portions each have a polarization portion that polarizes the light beams transmitted through the plurality of window portions.

9. The optical element according to claim 8,
wherein a direction of the polarization has a plurality of types.

10. The optical element according to claim 8,
wherein the polarization portion is a wire grid or a slit formed in the plurality of window portions depending on a direction of the polarization.

11. The optical element according to claim 1,
wherein the frame has a light-transmitting property.

12. The optical element according to claim 1,
wherein the frame has an aperture in a portion on which the plurality of optical filters are installed, and
the optical element further comprises an aperture area adjustment member that adjusts an area of the aperture.

13. The optical element according to claim 1,
wherein the plurality of optical filters are installed on the inclined surface portion at inclination angles corresponding to the wavelength ranges of the light beams transmitted through the optical filters.

14. An optical device comprising:
the optical element according to claim 1; and
a lens that forms an optical image of a subject,
wherein the optical element is disposed on an optical path of a light beam transmitted through the lens in a state in which an optical axis of the optical element and an optical axis of the lens coincide with each other.

15. An imaging apparatus comprising:
the optical device according to claim 14;
the imaging element; and
a signal processing unit that generates a plurality of images corresponding to the wavelength ranges of the plurality of optical filters, respectively, based on a signal output from the imaging element.

16. The imaging apparatus according to claim 15,
wherein the imaging element includes a plurality of types of optical filters having different transmission wavelength ranges, and a plurality of types of polarization portions having different polarization directions on a pixel.

17. An optical element comprising:
a plurality of optical filters including two or more optical filters that transmit light beams having at least partially different wavelength ranges,
wherein an imaging element includes a plurality of pixel groups that selectively receive a light beam transmitted through any of the plurality of optical filters; and
a frame having an inclined surface portion with an optical axis center as an apex, in which the plurality of optical filters are installed on the inclined surface portion,
wherein a plurality of window portions each have a polarization portion that polarizes the light beams transmitted through the plurality of window portions.

18. The optical element according to claim 17,
wherein a direction of the polarization has a plurality of types.

19. The optical element according to claim 17,
wherein the polarization portion is a wire grid or a slit formed in the plurality of window portions depending on a direction of the polarization.

20. The optical element according to claim 17,
wherein the frame has a light-transmitting property.

21. The optical element according to claim 17,
wherein the frame has an aperture in a portion on which the plurality of optical filters are installed, and
the optical element further comprises an aperture area adjustment member that adjusts an area of the aperture.

22. The optical element according to claim 17,
wherein the plurality of optical filters are installed on the inclined surface portion at inclination angles corresponding to the wavelength ranges of the light beams transmitted through the optical filters.

23. An optical element comprising:
a plurality of optical filters including two or more optical filters that transmit light beams having at least partially different wavelength ranges,
wherein an imaging element includes a plurality of pixel groups that selectively receive a light beam transmitted through any of the plurality of optical filters; and
a frame having an inclined surface portion with an optical axis center as an apex, in which the plurality of optical filters are installed on the inclined surface portion,
wherein the frame has a light-transmitting property.

24. The optical element according to claim 23,
wherein the frame has an aperture in a portion on which the plurality of optical filters are installed, and
the optical element further comprises an aperture area adjustment member that adjusts an area of the aperture.

25. The optical element according to claim 23,
wherein the plurality of optical filters are installed on the inclined surface portion at inclination angles corresponding to the wavelength ranges of the light beams transmitted through the optical filters.

26. A manufacturing method of an optical element including a plurality of optical filters including two or more optical filters that transmit light beams having at least partially different wavelength ranges,
wherein an imaging element includes a plurality of pixel groups that selectively receive a light beam transmitted through any of the plurality of optical filters, and
a frame having an inclined surface portion with an optical axis center as an apex, in which the plurality of optical filters are installed on the inclined surface portion, the method comprising:
an installation step of installing the plurality of optical filters on a plurality of window portions;
an inclination adjustment step of adjusting inclinations of the optical filters with respect to the inclined surface portion; and
a fixation step of fixing the optical filters to the frame with a fixing member.

* * * * *